(12) United States Patent
Park et al.

(10) Patent No.: US 10,631,417 B2
(45) Date of Patent: Apr. 21, 2020

(54) DISPLAY APPARATUS AND METHOD OF MANUFACTURING THE SAME

(71) Applicant: Samsung Display Co., Ltd., Yongin-Si, Gyeonggi-Do (KR)

(72) Inventors: Junhong Park, Suwon-si (KR); Jung-Soo Lee, Seoul (KR); Jeongmin Park, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/686,462

(22) Filed: Aug. 25, 2017

(65) Prior Publication Data
US 2018/0092225 A1    Mar. 29, 2018

(30) Foreign Application Priority Data
Sep. 27, 2016    (KR) .................. 10-2016-0124231

(51) Int. Cl.
*H05K 7/06*  (2006.01)
*H05K 5/00*  (2006.01)
*G02F 1/1362*  (2006.01)
*H04N 9/31*  (2006.01)

(52) U.S. Cl.
CPC ..... *H05K 5/0017* (2013.01); *G02F 1/136227* (2013.01); *H04N 9/3102* (2013.01); *H05K 7/06* (2013.01); *G02F 2201/40* (2013.01)

(58) Field of Classification Search
CPC .................................................. H05K 5/0017
USPC ......................................................... 361/748
See application file for complete search history.

(56) References Cited

U.S. PATENT DOCUMENTS

| | | | |
|---|---|---|---|
| 2004/0046914 A1* | 3/2004 | Hirota | G02F 1/133707 349/129 |
| 2015/0042936 A1* | 2/2015 | Park | G02F 1/133345 349/122 |
| 2015/0092143 A1* | 4/2015 | Cha | G02F 1/1341 349/106 |
| 2017/0059952 A1* | 3/2017 | Itou | G02F 1/136286 |
| 2017/0263644 A1* | 9/2017 | Chang | H01L 21/76895 |
| 2017/0271370 A1* | 9/2017 | Wang | H01L 27/124 |
| 2017/0277008 A1* | 9/2017 | Jiang | G02F 1/136286 |

FOREIGN PATENT DOCUMENTS

KR   1020020083511 A   11/2002

* cited by examiner

*Primary Examiner* — Stanley Tso
(74) *Attorney, Agent, or Firm* — Cantor Colburn LLP

(57) ABSTRACT

A display apparatus includes a base substrate, a first conductive pattern disposed on the base substrate, a first insulation layer disposed on the base substrate to cover the first conductive pattern, where a first contact hole is defined through the first insulation layer, a first pattern disposed on the first insulation layer, where the first pattern is in contact with the first conductive pattern through the first contact hole, a first filling pattern disposed in a recess of the first pattern which is defined by the first contact hole, a second insulation layer disposed on the first pattern and the first insulation layer, where a second contact hole overlapping the first contact hole is defined through the second insulation layer, and a second conductive pattern electrically connected to the first pattern through the second contact hole.

14 Claims, 22 Drawing Sheets

DISPLAY APPARATUS AND METHOD OF MANUFACTURING THE SAME

This application claims priority to Korean Patent Application No. 10-2016-0124231, filed on Sep. 27, 2016, and all the benefits accruing therefrom under 35 U.S.C. § 119, the content of which in its entirety is herein incorporated by reference.

BACKGROUND

1. Field

Exemplary embodiments of the invention relate to a display apparatus and a method of manufacturing the display apparatus. More particularly, exemplary embodiments of the invention relate to a display apparatus having a high-resolution and a method of manufacturing the display apparatus.

2. Description of the Related Art

Recently, a display apparatus having a light weight and a small size has been manufactured. A cathode ray tube ("CRT") display apparatus has been used due to a performance and a competitive price. However the CRT display apparatus has a weakness with respect to size or portability. Therefore, recently, a display apparatus, such as a plasma display apparatus, a liquid crystal display apparatus and an organic light emitting display apparatus, for example, has been widely used due to a small size, a light weight and low-power-consumption of such a display apparatus.

SUMMARY

Efforts have been made to improve a resolution of a display apparatus to improve display quality of the display apparatus. However, as the resolution of the display apparatus increases, a structure of a pixel becomes complicated, and as a result, aperture ratio may be lowered. Especially, a portion where a contact hole is formed is difficult to be constituted by an opening through which light for displaying the image passes. As the structure of the pixel is complicated, the number of the contact holes is increased, and as a result, the aperture ratio is reduced.

One or more exemplary embodiments of the invention relate to a display apparatus having a high resolution and with improved aperture ratio.

One or more exemplary embodiments of the invention relate to a method of manufacturing the display apparatus.

According to an exemplary embodiment of the invention, a display apparatus includes a base substrate, a first conductive pattern disposed on the base substrate, a first insulation layer disposed on the base substrate to cover the first conductive pattern, where a first contact hole is defined through the first insulation layer, a first pattern disposed on the first insulation layer, where the first pattern is in contact with the first conductive pattern through the first contact hole, a first filling pattern disposed in a recess of the first pattern which is defined by the first contact hole, a second insulation layer disposed on the first pattern and the first insulation layer, where a second contact hole overlapping the first contact hole is defined through the second insulation layer, and a second conductive pattern electrically connected to the first pattern through the second contact hole.

In an exemplary embodiment, each of the first and second contact holes may have a truncated cone shape in which a lower end thereof is narrower than an upper end thereof. The first contact hole may have a first width at the lower end thereof. The second contact hole may have a second width at the lower end thereof. The second width may be greater than or equal to the first width.

In an exemplary embodiment, the first width may be less than about 2 micrometers (μm).

In an exemplary embodiment, the first filling pattern may include a photoresist.

In an exemplary embodiment, a contacting surface of the first pattern and the second conductive pattern may have a ring shape.

In an exemplary embodiment, the display apparatus may include a first capping pattern disposed between the first filling pattern and the second conductive pattern and in contact with the first pattern, the first filling pattern and the second conductive pattern.

In an exemplary embodiment, a contacting surface of the first pattern and the second conductive pattern may have a circle shape.

In an exemplary embodiment, the contacting surface of the first pattern and the second conductive pattern may be within a boundary of an upper end of the first contact hole.

In an exemplary embodiment, the first conductive pattern may include an element of a thin film transistor, and the second conductive pattern may include a pixel electrode.

In an exemplary embodiment, the display apparatus may further include a color filter disposed between the pixel electrode and the second insulation layer.

In an exemplary embodiment, the display apparatus may further include a common electrode disposed between the color filter and the pixel electrode.

According to another exemplary embodiment of the invention, a display apparatus includes a base substrate, a first conductive pattern disposed on the base substrate, a first insulation layer disposed on the base substrate to cover the first conductive pattern, where a first contact hole is defined through the first insulation layer, a first pattern disposed on the first insulation layer, where the first pattern is in contact with the first conductive pattern through the first contact hole, a first filling pattern disposed in a recess of the first pattern which is defined by the first contact hole, a second insulation layer disposed on the first pattern and the first insulation layer, where a second contact hole overlapping the first contact hole is defined through the second insulation layer, a second pattern disposed on the second insulation layer and in contact with the first pattern through the second contact hole, a second filling pattern disposed in a recess of the second pattern which is defined by the second contact hole, a third insulation layer disposed on the second pattern and the second insulation layer, where a third contact hole overlapping the second contact hole is defined through the third insulation layer, and a second conductive pattern electrically connected to the second pattern through the third contact hole.

In an exemplary embodiment, each of the first to third contact holes may have a truncated cone shape in which a lower end thereof is narrower than an upper end thereof. The first contact hole may have a first width at the lower end thereof. The second contact hole may have a second width at the lower end thereof. The third contact hole may have a third width at the lower end thereof. The second width may be greater than or equal to the first width, and the third width may be greater than or equal to the second width.

In an exemplary embodiment, the display apparatus may further include a first capping pattern disposed between the first filling pattern and the second pattern and in contact with the first pattern, the first filling pattern and the second pattern, and a second capping pattern disposed between the second filling pattern and the second conductive pattern and in contact with the second pattern, the second filling pattern and the second conductive pattern.

According to an exemplary embodiment of the invention, a method of manufacturing a display apparatus includes providing a first conductive pattern on a base substrate, providing a first insulation layer on the base substrate to cover the first conductive pattern, forming a first contact hole through the first insulation layer to expose the first conductive pattern, providing a first pattern on the first insulation layer to be in contact with the first conductive pattern through the first contact hole, providing a first filling pattern in a recess of the first pattern formed by the first contact hole, providing a second insulation layer on the first insulation layer to cover the first filling pattern and the first pattern, forming a second contact hole overlapping the first contact hole through the second insulation layer, and providing a second conductive pattern on the second insulation layer, where the second conductive pattern is electrically connected to the first pattern through the second contact hole.

In an exemplary embodiment, each of the first and second contact holes may have a truncated cone shape in which a lower end thereof is narrower than an upper end thereof. The first contact hole may have a first width at the lower end thereof. The second contact hole may have a second width at the lower end thereof. The second width may be greater than or equal to the first width.

In an exemplary embodiment, the first width may be less than about 2 μm.

In an exemplary embodiment, the providing the first filling pattern may include coating a negative type photoresist on the first pattern and the first insulation layer, and removing a portion of the photoresist by developing the photoresist to form the first filling pattern.

In an exemplary embodiment, the method may further include providing a first capping pattern between the first filling pattern and the second conductive pattern. The providing the first pattern, the providing the first filling pattern and the providing the first capping pattern may be performed by: providing a first pattern layer on the first insulation layer; providing the first filling pattern in the recess of the first pattern formed by the first contact hole; providing a first capping pattern layer on the first pattern layer to cover the first filling pattern; and providing the first pattern and the first capping pattern by simultaneously pattering the first pattern layer and the first capping layer.

In an exemplary embodiment, the method may further include providing a color filter between the second conductive pattern and the first insulation layer. The first conductive pattern may include an element of a thin film transistor, and the second conductive pattern includes a pixel electrode.

According to exemplary embodiments of the invention, as the first contact hole and the second contact hole are disposed to overlap each other, non-opening area where the image is not displayed by the contact hole is minimized, and an aperture ratio can be improved compared to a structure in which the contact holes do not overlap each other. Accordingly, a high-resolution display apparatus in which the size of one pixel is relatively small may be realized.

In exemplary embodiments, the first filling pattern may fill the recess of the first pattern formed by the first contact hole, so that the first capping pattern may be formed relatively flat. Accordingly, contact area of the second conductive pattern and the first capping pattern through the second contact hole, which overlaps the first contact hole, may be secured.

In exemplary embodiments, the first width of the first contact hole is smaller than or equal to the second width of the second contact hole, and the first width may be less than about 2 μm, so that a non-opening area where the image is not displayed by the contact hole may be minimized.

In exemplary embodiments, when a portion of the second insulation layer is removed to form the second contact hole, the upper surface of the first capping pattern is sufficiently high by the first filling pattern, so that etching degree of the second insulating layer for exposing the first capping pattern is respectively small compared to a structure in which the first filling pattern does not exist. Accordingly, it is less likely that the pattern (e.g., the first capping pattern or the first pattern) will be damaged by over-etching of the second insulating layer.

In exemplary embodiments, the first filling pattern may be formed only by forming a photoresist layer and developing the photoresist layer without using an exposing process, and the first capping pattern may be pattern with the first pattern, so that manufacturing process may be simplified.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1A:
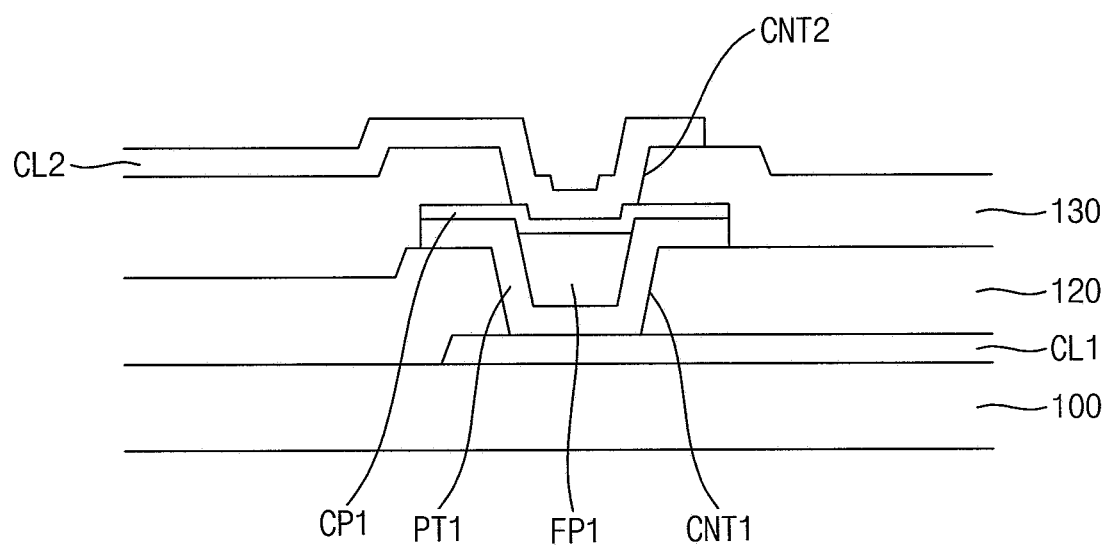
FIG. 1A is a cross-sectional view illustrating a portion a display apparatus according to an exemplary embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of the invention will be described in detail with reference to the accompanying drawings.

Figure 1B:
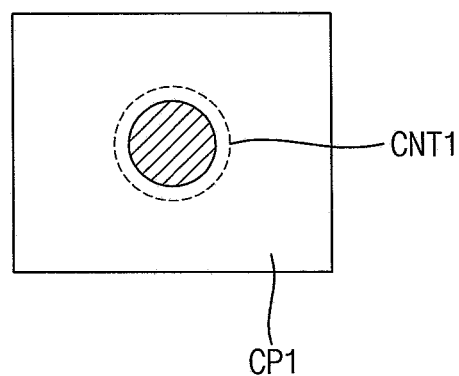
FIG. 1B is a plan view illustrating an upper surface of a capping pattern of the display apparatus of FIG. 1A.

FIG. 1A is a cross-sectional view illustrating a portion of a display apparatus according to an exemplary embodiment of the invention. FIG. 1B is a plan view illustrating an upper surface of a capping pattern of the display apparatus of FIG. 1A.

Referring to FIG. 1A, an exemplary embodiment of the display apparatus may include a base substrate 100, a first conductive pattern CL1, a first insulation layer 120, a first pattern PT1, a first filling pattern FP1, a first capping pattern CP1, a second insulation layer 130, and a second conductive pattern CL2.

The base substrate 100 may be a transparent insulation substrate. In one exemplary embodiment, for example, the base substrate 100 may include or be a glass substrate, a quartz substrate or a transparent resin substrate, for example. In an embodiment, where the base substrate 100 is the transparent resin substrate, the base substrate 100 may include polyimide-based resin, acryl-based resin, polyacrylate-based resin, polycarbonate-based resin, polyether-based resin, sulfonic acid containing resin, or polyethyleneterephthalate-based resin, for example.

The first conductive pattern CL1 may be disposed on the base substrate 100. The first conductive pattern CL1 may be a component of a circuit for transmitting a signal for driving pixels of the display apparatus. In one exemplary embodiment, for example, the first conductive pattern CL1 may be a drain electrode of a thin film transistor.

The first insulation layer 120 may be disposed on the base substrate 100 on which the first conductive pattern CL1 is disposed. The first insulation layer 120 may be disposed to cover the first conductive pattern CL1. The first insulation layer 120 may include or be formed using a silicon oxide or a metal oxide, for example. In one exemplary embodiment, for example, the first insulation layer 120 may include or be formed using silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx) or titanium oxide (TiOx). Such materials may be used alone or in a combination thereof to form the first insulation layer 120. In exemplary embodiments, the first insulation layer 120 may be uniformly provided or formed on the base substrate 100 along a profile of the first conductive pattern CL1. In such an embodiment, the first insulation layer 120 may have a substantially small thickness, such that a stepped portion may be defined at a portion of the first insulation layer 120 adjacent to the first conductive pattern CL1. In some exemplary embodiments, the first insulation layer 120 may have a relatively large thickness for sufficiently covering the first conductive pattern CL1, so that the first insulation layer 120 may have a substantially flat surface.

In some exemplary embodiment, the first insulation layer 120 may include or be formed using an organic insulation material. In one exemplary embodiment, for example, the first insulation layer 120 may include at least one of a photoresist, an acryl-based resin, a polyimide-based resin, a polyamide-based resin, a siloxane-based resin and a combination thereof.

A first contact hole CNT1 may be defined or formed through the first insulation layer 120 to expose the first conductive pattern CL1. The first contact hole CNT1 may have truncated cone shape in which lower end is narrower than the upper end, as shown in FIG. 1A. The first contact hole CNT1 may have a first width at the lower end. The first width may be less than about 2 micrometers ($\mu$m).

The first pattern PT1 may be disposed on the first insulation layer 120 through which the first contact hole CNT1 is defined. The first pattern PT1 may make contact with the first conductive pattern CL1 through the first contact hole CNT1. The first pattern PT1 may be a component of the circuit for transmitting the signal for driving the pixels of the display apparatus. In one exemplary embodiment, for example, the first pattern PT1 may be a portion of a data pattern which includes a data line.

The first filling pattern FP1 may be disposed on the first pattern PT1 in the first contact hole CNT1. The first filling pattern FP1 may include or be formed using an organic insulation material. In one exemplary embodiment, for example, the first filling pattern FP1 may include a photoresist.

The first filling pattern FP1 may fill a recess of the first pattern PT1 formed by the first contact hole CNT1, so that a height of a lower surface of the first capping pattern CP1 from the first conductive pattern CL1 may be effectively prevented from being lowered.

The first capping pattern CP1 may be disposed on the first pattern PT1 on which the first filling pattern FP1 is disposed. The first capping pattern CP1 may be disposed to cover the first filling pattern FP1. The first capping pattern CP1 may include or be formed using a metal, an alloy, a conductive metal oxide or a transparent conductive material, for example.

The second insulation layer 130 may be disposed on the first insulation layer 120 on which the first pattern PT1 and the first capping pattern CP1 are disposed. The second insulation layer 130 may be disposed to cover the first pattern PT1 and the first capping pattern CP1. The second insulation layer 130 may include or be formed using a silicon oxide or a metal oxide, for example. In exemplary embodiments, the second insulation layer 130 may be entirely or uniformly disposed on the first insulation layer 120. In some exemplary embodiments, the second insulation layer 130 may have a substantially small thickness, such that a stepped portion may be formed at a portion of the second insulation layer 130 adjacent to the first capping pattern CP1. In some exemplary embodiments, the second insulation layer 130 may have a relatively large thickness for sufficiently covering the first pattern PT1 and the first capping pattern CP1, so that the first insulation layer 120 may have a substantially flat surface.

In some exemplary embodiment, the second insulation layer 130 may include or be formed using an organic insulation material.

A second contact hole CNT2 exposing the first capping pattern CP1 may be defined or formed through the second insulation layer 130. The second contact hole CNT2 may have a truncated cone shape in which lower end is narrower than the upper end. The second contact hole CNT2 has a second width at the lower end. The second contact hole CNT2 may overlap the first contact hole CNT1. In such an embodiment, the second width of the second contact hole CNT2 may be greater than or equal to the first width of the first contact hole CNT1.

The second conductive pattern CL2 may be disposed on the second insulation layer 130 at which the second contact hole CNT2 is disposed. The second conductive pattern CL2 may make contact with the first capping pattern CP1 through the second contact hole CNT2. The second conductive pattern CL2 may be a component of the circuit for transmitting the signal for driving the pixels of the display apparatus. In one exemplary embodiment, for example, the second conductive pattern CL2 may be a portion of a pixel electrode which includes a transparent conductive material.

Referring to FIG. 1B, a contacting surface (shaded portion in the figure) of the first capping pattern CP1 and the second conductive pattern CL2 will hereinafter be described. The contacting surface may have a circular shape. The contacting surface may be smaller than or disposed within a boundary of the upper end of the first contact hole CNT1 (dotted line in the figure). In some exemplary embodiment, the contacting surface may be greater than or equal to the boundary of the upper end of the first contact hole CNT1.

Although not shown in the figures, the display apparatus may further include an opposite substrate facing the base substrate, and a liquid crystal layer between the opposite substrate and the base substrate.

According to exemplary embodiments of the invention, as the first contact hole CNT1 and the second contact hole CNT2 are disposed to overlap each other, non-opening area where the image is not displayed by the contact hole is minimized, and an aperture ratio can be improved compared to a structure in which the contact holes do not overlap each other. Accordingly, a high-resolution display apparatus in which the size of a pixel is relatively small may be realized.

In such embodiments, the first filling pattern FP1 may fill the recess of the first pattern PT1 formed by the first contact hole CNT1, so that the first capping pattern CP1 may be relatively flat. Accordingly, a contact area of the second conductive pattern CL2 and the first capping pattern CP1 through the second contact hole CNT2 which overlaps the first contact hole CNT1 may be secured.

In such embodiments, the first width of the first contact hole CNT1 is smaller than or equal to the second width of the second contact hole CNT2, and the first width may be less than about 2 $\mu$m, so that a non-opening area where the image is not displayed by the contact hole may be minimized.

In such embodiments, when a portion of the second insulation layer 130 is removed to form the second contact hole CNT2, the upper surface of the first capping pattern CP1 is sufficiently high by the first filling pattern FP1, so that etching degree of the second insulating layer 130 for exposing the first capping pattern CP1 is respectively small compared to a structure in which the first filling pattern FP1 does not exist. Accordingly, the pattern (e.g., the first capping pattern or the first pattern) may be effectively prevented from being damaged by over-etching of the second insulating layer 130.

Figure 2A:
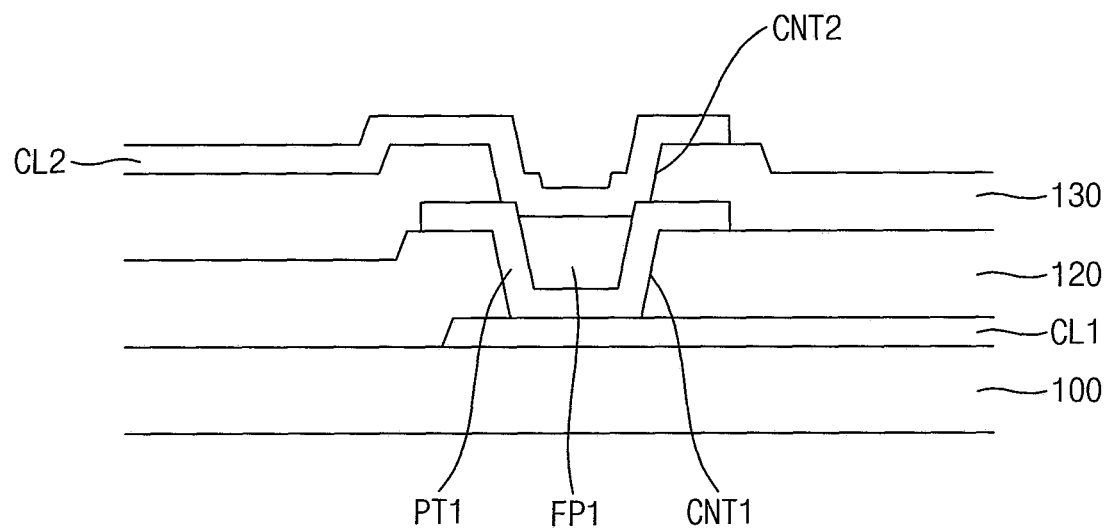
FIG. 2A is a cross-sectional view illustrating a portion of a display apparatus according to an alternative exemplary embodiment of the invention.
Figure 2B:
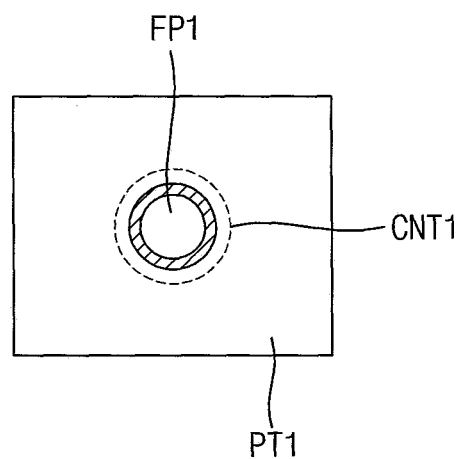
FIG. 2B is a plan view illustrating an upper surface of a first pattern of the display apparatus of FIG. 2A.

FIG. 2A is a cross-sectional view illustrating a portion of a display apparatus according to an alternative exemplary embodiment of the invention. FIG. 2B is a plan view illustrating an upper surface of a first pattern of the display apparatus of FIG. 2A. The display apparatus shown in FIG. 2A may be substantially the same as the display apparatus of FIG. 1A, except that that the display apparatus does not include a first capping pattern. Thus, any repetitive detailed descriptions of same or like elements will be omitted or simplified.

Referring to FIG. 2A, an exemplary embodiment of the display apparatus may include a base substrate 100, a first conductive pattern CL1, a first insulation layer 120, a first pattern PT1, a first filling pattern FP1, a second insulation layer 130 and a second conductive pattern CL2.

The first conductive pattern CL1 may be disposed on the base substrate 100. The first insulation layer 120 may be disposed on the base substrate 100 on which the first conductive pattern CL1 is disposed. The first insulation layer 120 may be disposed to cover the first conductive pattern CL1. A first contact hole CNT1 may be defined or formed through the first insulation layer 120 to expose the first conductive pattern CL1. The first pattern PT1 may be disposed on the first insulation layer 120 through which the first contact hole CNT1 is formed. The first filling pattern FP1 may be disposed on the first pattern PT1 in the first contact hole CNT1.

The second insulation layer 130 may be disposed on the first insulation layer 120 on which the first pattern PT1 is disposed. The second insulation layer 130 may be disposed to cover the first pattern PT1. A second contact hole CNT2 exposing the first pattern PT1 may be defined or formed through the second insulation layer 130.

The second conductive pattern CL2 may be disposed on the second insulation layer 130 through which the second contact hole CNT2 is defined. The second conductive pattern CL2 may make contact with the first pattern PT1 through the second contact hole CNT2.

Referring to FIG. 2B, a contacting surface (shaded portion in the figure) of the first pattern PT1 and the second conductive pattern CL2 will hereinafter be described. The contacting surface may have a ring shape. An outer boundary of the contacting surface may be smaller than or disposed within a boundary of the upper end of the first contact hole CNT1 (dotted line in the figure). In some exemplary embodiment, the outer boundary of the contacting surface may be greater than or equal to the boundary of the upper end of the first contact hole CNT1.

According to exemplary embodiments of the invention, the contacting surface of the first pattern PT1 and the second conductive pattern CL2 has the ring shape, the contact surface is smaller than that of the display device of FIG. 1B, and smaller contact surface may be less desirable in terms of current holding. However, if voltage holding is relatively more important than the current holding like a liquid crystal display apparatus, the first capping pattern may be omitted as shown in FIG. 2A, to simplify the structure.

Figure 3:
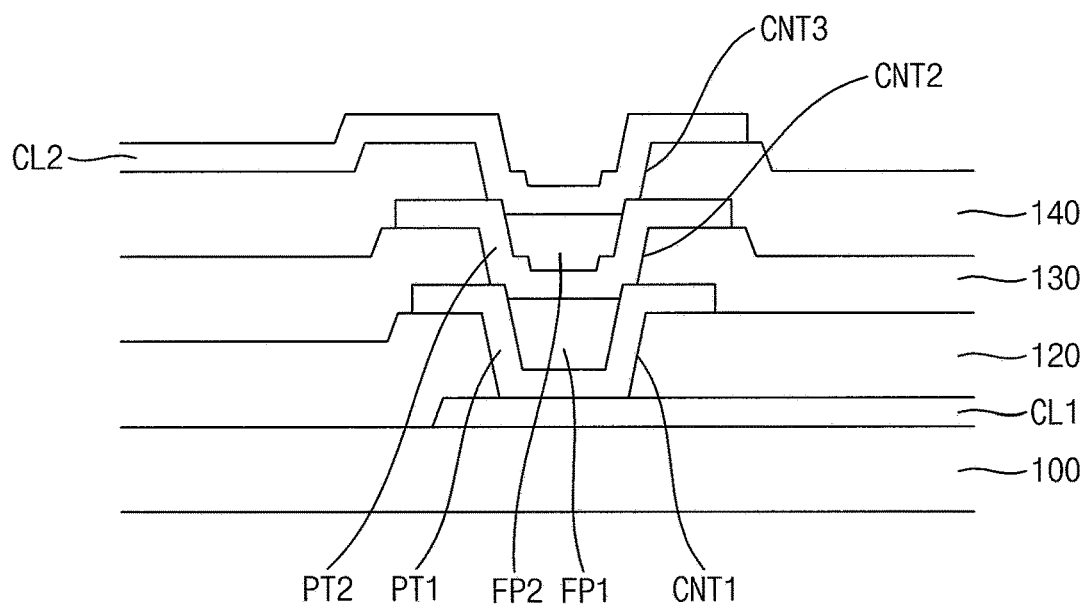
FIG. 3 is a cross-sectional view illustrating a portion of a display apparatus according to another alternative exemplary embodiment of the invention.

FIG. 3 is a cross-sectional view illustrating a portion of a display apparatus according to another alternative exemplary embodiment of the invention. The display apparatus of FIG. 3 may be substantially the same as the display apparatus of FIG. 2A, except that the display apparatus further includes a second pattern PT2, a second filling pattern FP2 and a third insulation layer 140. Thus, any repetitive detailed descriptions of the same or like elements will be omitted or simplified.

Referring to FIG. 3, an exemplary embodiment of the display apparatus may include a base substrate 100, a first conductive pattern CL1, a first insulation layer 120, a first pattern PT1, a first filling pattern FP1, a second insulation layer 130, a second pattern PT2, a second filling pattern FP2, a third insulation layer 140 and a second conductive pattern CL2.

The first conductive pattern CL1 may be disposed on the base substrate 100. The first insulation layer 120 may be disposed on the base substrate 100 on which the first conductive pattern CL1 is disposed. The first insulation layer 120 may be disposed to cover the first conductive pattern CL1. A first contact hole CNT1 may be defined or formed through the first insulation layer 120 to expose the first conductive pattern CL1. The first pattern PT1 may be disposed on the first insulation layer 120 through which the first contact hole CNT1 is defined. The first filling pattern FP1 may be disposed on the first pattern PT1 in the first contact hole CNT1. The second insulation layer 130 may be disposed on the first insulation layer 120 on which the first pattern PT1 and the first filling pattern FP1 are disposed. The second insulation layer 130 may be disposed to cover the first pattern PT1 and the first filling pattern FP1. A second contact hole CNT2 exposing the first pattern PT1 may be defined or formed through the second insulation layer 130.

The second pattern PT2 may be disposed on the second insulation layer 130 through which the second contact hole CNT2 is defined. The second pattern PT2 may make contact with the first pattern PT1 through the second contact hole CNT2. The second pattern PT2 may be a component of a circuit for transmitting a signal for driving pixels of the display apparatus. In one exemplary embodiment, for example, the second pattern PT2 may be a portion of a data pattern including a signal line.

The second filling pattern FP2 may be disposed on the second pattern PT2 in the second contact hole CNT2. The second filling pattern FP2 may include or be formed using an organic insulation material. In one exemplary embodiment, for example, the second filling pattern FP2 may include a photoresist.

The third insulation layer 140 may be disposed on the second insulation layer 130 on which the second pattern PT2 and the second filling pattern FP2 are disposed. The third insulation layer 140 may be disposed to cover the second pattern PT2 and the second filling pattern FP2. A third contact hole CNT3 may be defined or formed through the third insulation layer 140 to expose the second pattern PT2.

The second conductive pattern CL2 may be disposed on the third insulation layer 140 through which the third contact hole CNT3 is defined. The second conductive pattern CL2 may make contact with the second pattern PT2 through the third contact hole CNT3.

Each of the first to third contact holes CNT1, CNT2 and CNT3 may have a truncated cone shape in which the lower end is narrower than the upper end. The first contact hole CNT1 may have a first width at the lower end. The first width may be less than about 2 μm. The second contact hole CNT2 may have a second width at the lower end. The third contact hole CNT3 may have a third width at the lower end. In an exemplary embodiment, the second width may be greater than or equal to the first width. In such an embodiment, the third width may be greater than or equal to the second width.

Figure 4:
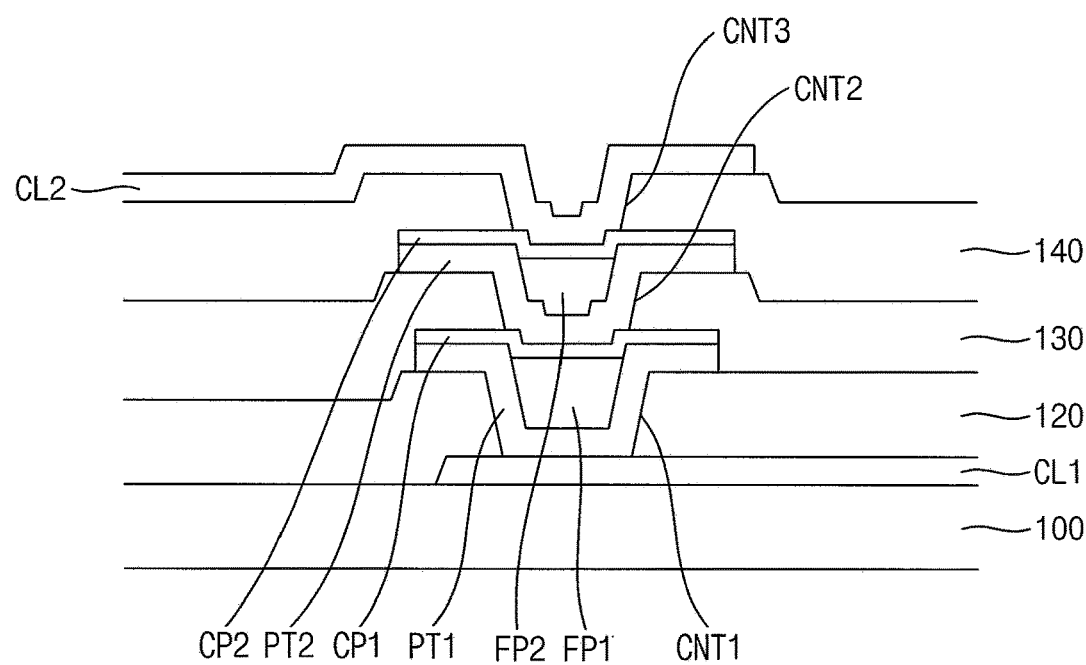
FIG. 4 is a cross-sectional view illustrating a portion of a display apparatus according to another alternative exemplary embodiment of the invention.

FIG. 4 is a cross-sectional view illustrating a portion of a display apparatus according to another alternative exemplary embodiment of the invention. The display apparatus of FIG. 4 may be substantially the same as the display apparatus of FIG. 1A, except that that the display apparatus further include a second pattern PT2, a second capping pattern CP2, a second filling pattern FP2 and a third insulation layer 140. Thus, any repetitive detailed descriptions of the same or like elements will be omitted or simplified.

Referring to FIG. 4, an exemplary embodiment of the display apparatus may include a base substrate 100, a first conductive pattern CL1, a first insulation layer 120, a first pattern PT1, a first filling pattern FP1, a second insulation layer 130, a second pattern PT2, a second capping pattern CP2, a second filling pattern FP2, a third insulation layer 140 and a second conductive pattern CL2.

The first conductive pattern CL1 may be disposed on the base substrate 100. The first insulation layer 120 may be disposed on the base substrate 100 on which the first conductive pattern CL1 is disposed. The first insulation layer 120 may be disposed to cover the first conductive pattern CL1. A first contact hole CNT1 may be defined or formed through the first insulation layer 120 to expose the first conductive pattern CL1. The first pattern PT1 may be disposed on the first insulation layer 120 through which the first contact hole CNT1 is formed. The first filling pattern FP1 may be disposed on the first pattern PT1 in the first contact hole CNT1. The first capping pattern CP1 may be disposed on the first pattern PT1 on which the first filling pattern FP1 is disposed. The first capping pattern CP1 may be disposed to cover the first filling pattern FP1. The second insulation layer 130 may be disposed on the first insulation layer 120 on which the first capping pattern CP1 is disposed. The second insulation layer 130 may be disposed to cover the first capping pattern CP1. A second contact hole CNT2 may be defined or formed through the second insulation layer 130 to expose the first capping pattern CP1.

The second pattern PT2 may be disposed on the second insulation layer 130 through which the second contact hole CNT2 is defined. The second pattern PT2 may make contact with the first capping pattern CP1 through the second contact hole CNT2. The second pattern PT2 may be a component of a circuit for transmitting a signal for driving pixels of the display apparatus. In one exemplary embodiment, for example, the second pattern PT2 may be a portion of a second data pattern including a signal line.

The second filling pattern FP2 may be disposed on the second pattern PT2 in the second contact hole CNT2. The second filling pattern FP2 may include or be formed using an organic insulation material. In one exemplary embodiment, for example, the second filling pattern FP2 may include a photoresist.

The second capping pattern CP2 may be disposed on the second pattern PT2 on which the second filling pattern FP2 is disposed. The second capping pattern CP2 may be disposed to cover the second filling pattern FP2. The second capping pattern CP2 may include or be formed using a metal, alloy, a conductive metal oxide or a transparent conductive material, for example.

The third insulation layer 140 may be disposed on the second insulation layer 130 on which the second capping pattern CP2 is disposed. The third insulation layer 140 may be disposed to cover the second capping pattern CP2. A third contact hole CNT3 may be defined or formed through the third insulation layer 140 to expose the second pattern PT2.

The second conductive pattern CL2 may be disposed on the third insulation layer 140 through which the third contact hole CNT3 is defined. The second conductive pattern CL2 may make contact with the second capping pattern CP2 through the third contact hole CNT3.

Each of the first to third contact holes CNT1, CNT2 and CNT3 may have a truncated cone shape in which the lower end is narrower than the upper end. The first contact hole CNT1 may have a first width at the lower end. The first width may be less than about 2 μm. The second contact hole CNT2 may have a second width at the lower end. In an exemplary embodiment, the third contact hole CNT3 may have a third width at the lower end. The second width may be greater than or equal to the first width. In such an embodiment, the third width may be greater than or equal to the second width.

Figure 5:
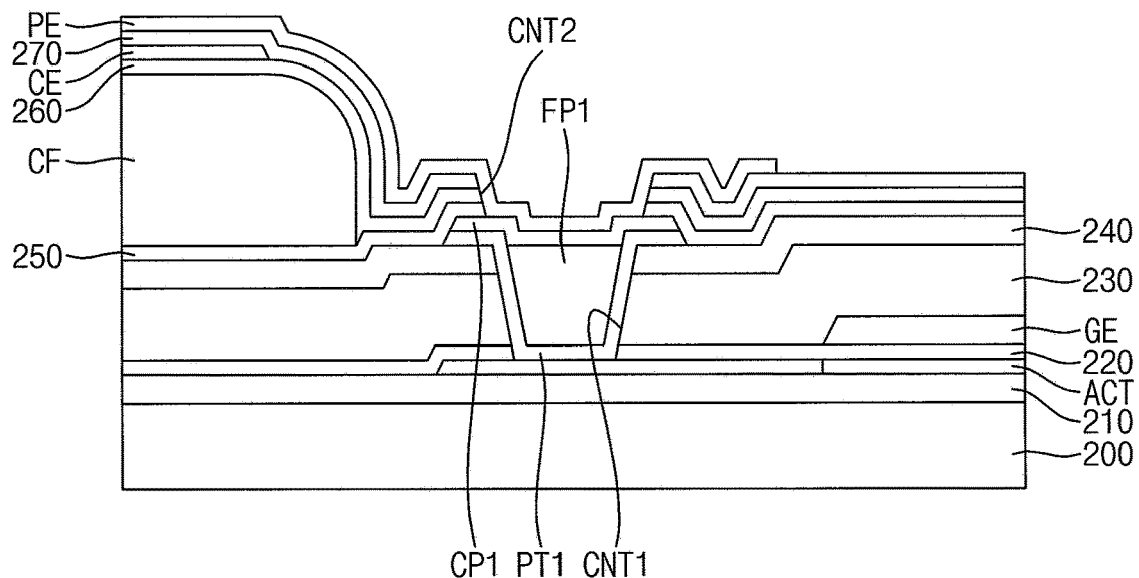
FIG. 5 is a cross-sectional view illustrating a portion of a display apparatus according to another alternative exemplary embodiment of the invention.

FIG. 5 is a cross-sectional view illustrating a portion of a display apparatus according to another alternative exemplary embodiment of the invention.

Referring to FIG. 5, an exemplary embodiment of the display apparatus may include a base substrate 200, a buffer layer 210, an active pattern ACT, a first insulation layer 220, a gate pattern including a gate electrode GE, a second insulation layer 230, a first data pattern, a third insulation layer 240, a second data pattern including a first pattern PT1, a first filling pattern FP1, a first capping pattern CP1, a fourth insulation layer 250, a color filter CF, a fifth insulation layer 260, a common electrode CE, a sixth insulation layer 270 and a pixel electrode PE.

The base substrate 200 may include or be a transparent insulation substrate. In one exemplary embodiment, for example, the base substrate 200 may include a glass substrate, a quartz substrate or a transparent resin substrate.

The buffer layer 210 may be disposed on the base substrate 200. In an exemplary embodiment, the buffer layer 210 may effectively prevent diffusion of metal atoms and/or impurities from the base substrate 200. In such an embodiment, the buffer layer 210 may adjust heat transfer rate of a successive crystallization process for the active pattern ACT to be substantially uniform. In an exemplary embodiment, where the base substrate 200 may have a relatively irregular surface, the buffer layer 210 may improve flatness of the surface of the base substrate 100 or provide a flat surface on the base substrate 100. The buffer layer 210 may include or be formed using a silicon compound. In an exemplary embodiment, the buffer layer 210 may have a single layer structure or a multi-layer structure.

The active pattern ACT may be disposed on the buffer layer 210. The active pattern may include a source area and a drain area, each of which is impurity-doped area, and the active pattern may further include a channel area between the source area and the drain area.

The first insulation layer 220 may be disposed on the buffer layer 210 on which the active pattern ACT is disposed. The first insulation layer 220 may be to cover the active pattern ACT. The first insulation layer 220 may include an organic insulation material or inorganic insulation material.

The gate pattern may be disposed on the first insulation layer 220. The gate pattern may include or be formed using a metal, alloy, a metal nitride, a conductive metal oxide or a transparent conductive material, for example. The gate pattern may include the gate electrode GE which overlaps the active pattern ACT and a signal line for transmitting a signal to drive pixels, such as a gate line.

The second insulation layer 230 may be disposed on the first insulation layer 220 on which the gate pattern is disposed. The second insulation layer 230 may be disposed to cover the gate pattern. The second insulation layer 230 may include an organic insulation material or inorganic insulation material.

The first data pattern (not shown) may be disposed on the second insulation layer 230. The first data pattern may include a signal line for transmitting a signal to drive the pixels.

The third insulation layer 240 may be disposed on the second insulation layer 230 on which the first data pattern is disposed. The third insulation layer 240 may be disposed to cover the first data pattern. The third insulation layer 240 may include an organic insulation material or inorganic insulation material.

A first contact hole CNT1 may be defined or formed through the first to third insulation layers 220, 230 and 240. The first contact hole CNT1 may expose the drain electrode of the active pattern ACT. The first contact hole CNT1 may have truncated cone shape in which the lower end is narrower than the upper end. The first contact hole CNT1 may have a first width at the lower end. The first width may be less than about 2 μm.

The second data pattern may be disposed on the third insulation layer 240. The second data pattern may include or be formed using a metal, an alloy, a metal nitride, a conductive metal oxide or a transparent conductive material, for example. The second data pattern may include the first pattern PT1.

The first pattern PT1 may make contact with the drain area of the active pattern ACT through the first contact hole CNT1.

The first filling pattern FP1 may be disposed on the first pattern PT1 in the first contact hole CNT1. The first filling pattern FP1 may include or be formed using an organic insulation material. In one exemplary embodiment, for example, the first filling pattern FP1 may include a photoresist.

The first filling pattern FP1 may fill a recess of the first pattern PT1 formed by the first contact hole CNT1, so that a height of a lower surface of the first capping pattern CP1 from the active pattern ACT may be increased.

The first capping pattern CP1 may be disposed on the first pattern PT1 on which the first filling pattern FP1 is disposed. The first capping pattern CP1 may be disposed to cover the first filling pattern FP1. The first capping pattern CP1 may include or be formed using a metal, an alloy, a metal nitride, a conductive metal oxide or a transparent conductive material, for example.

The fourth insulation layer 250 may be disposed on the third insulation layer 240 on which the first capping pattern CP1 is disposed. The fourth insulation layer 250 may be disposed to cover the first capping pattern CP1. The forth insulation layer 250 may include an organic insulation material or inorganic insulation material.

The color filter CF may be disposed on the fourth insulation layer 250. The color filter CF may provide a color to light passing therethrough. The color filter CF may be a red color filter, a green color filter or a blue color filter. The color filter CF may be disposed to overlap or to correspond to each of the pixels, and may be disposed to have different color corresponding to pixels adjacent each other. The color filter CF may overlap or spaced apart from adjacent color filter at a boundary of pixels.

The fifth insulation layer 260 may be disposed on the fourth insulation layer 250 on which the color filter CF is disposed. The fifth insulation layer 260 may be disposed to cover the color filter CF. The fifth insulation layer 260 may include an organic insulation material or inorganic insulation material.

The common electrode CE may be disposed on the fifth insulation layer 260 and overlap the color filter CF. The common electrode CE may include a transparent conductive material. In one exemplary embodiment, for example, the common electrode CE may include indium tin oxide ("ITO"), indium zinc oxide ("IZO"), etc.

The sixth insulation layer 270 may be disposed on the fifth insulation layer 260 on which the common electrode CE is disposed. The sixth insulation layer 270 may be disposed to cover the common electrode CE. The sixth insulation layer 270 may include an organic insulation material or inorganic insulation material.

A second contact hole CNT2 may be defined or formed through the fourth to sixth insulation layers 250, 260 and 270. The second contact hole CNT2 may expose the first capping pattern CP1. The second contact hole CNT2 may have truncated cone shape in which the lower end is narrower than the upper end. The second contact hole CNT2 has a second width at the lower end. The second contact hole CNT2 may overlap the first contact hole CNT1. In such an embodiment, the second width of the second contact hole CNT2 may be greater than or equal to the first width of the first contact hole CNT1.

The pixel electrode PE may be disposed on the sixth insulation layer 270. The pixel electrode PE may be electrically connected to the first capping pattern CP1 through the second contact hole CNT2.

Although not shown in the figures, the display apparatus may include an opposite substrate facing the base substrate, and a liquid crystal layer between the base substrate and the opposite substrate.

Figure 6:
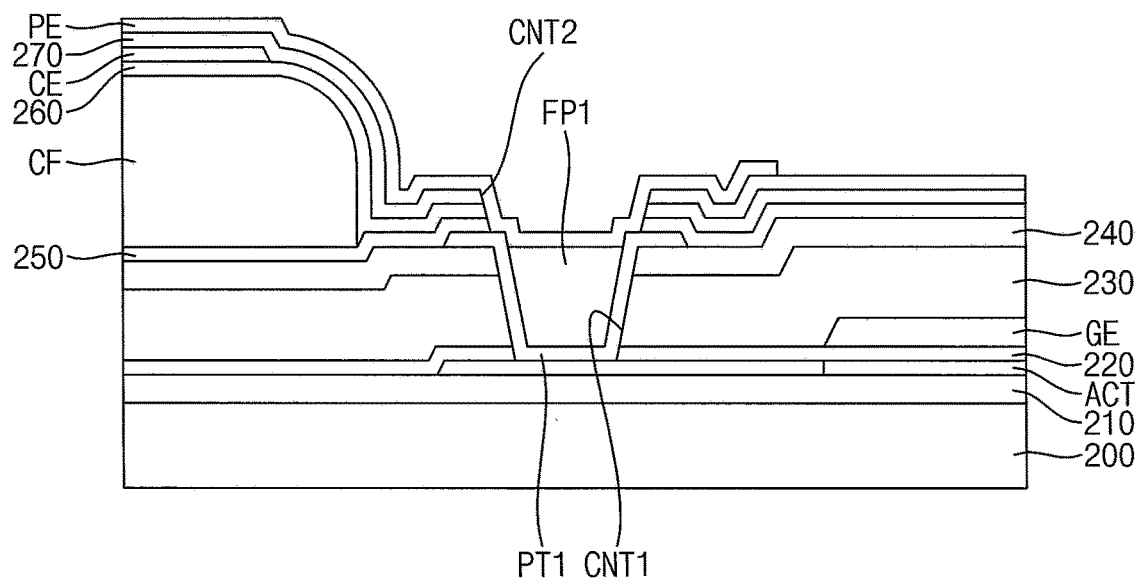
FIG. 6 is a cross-sectional view illustrating a portion of a display apparatus according to another alternative exemplary embodiment of the invention.

FIG. 6 is a cross-sectional view illustrating a portion of a display apparatus according to another alternative exemplary embodiment of the invention. The display apparatus of FIG. 6 may be substantially the same as the display apparatus of FIG. 5, except that that the display apparatus does not include a first capping pattern. Thus, any repetitive detailed descriptions of the same or like elements will be omitted or simplified.

Referring to FIG. 6, an exemplary embodiment of the display apparatus may include a base substrate 200, a buffer layer 210, an active pattern ACT, a first insulation layer 220, a gate pattern including a gate electrode GE, a second insulation layer 230, a first data pattern, a third insulation layer 240, a second data pattern including a first pattern PT1, a first filling pattern FP1, a fourth insulation layer 250, a color filter CF, a fifth insulation layer 260, a common electrode CE, a sixth insulation layer 270 and a pixel electrode PE.

The buffer layer 210 may be disposed on the base substrate 200. The active pattern ACT may be disposed on the buffer layer 210. The first insulation layer 220 may be disposed on the buffer layer 210 on which the active pattern ACT is disposed. The first insulation layer 220 may be disposed to cover the active pattern ACT. The gate pattern including the gate electrode GE may be disposed on the first insulation layer 220. The second insulation layer 230 may be disposed on the first insulation layer 220 on which the gate pattern is disposed. The second insulation layer 230 may be disposed to cover the gate pattern. The first data pattern (not shown) may be disposed on the second insulation layer 230. The third insulation layer 240 may be disposed on the second insulation layer 230 on which the first data pattern is disposed. The third insulation layer 240 may be disposed to cover the first data pattern. A first contact hole CNT1 may be defined or formed through the first to third insulation layers 220, 230 and 240.

The second data pattern including the first pattern PT1 may be disposed on the third insulation layer 240. The first pattern PT1 may make contact with the active pattern ACT, e.g., the drain area thereof, through the first contact hole CNT1. The first filling pattern FP1 may be disposed on the first pattern PT1 in the first contact hole CNT1.

The fourth insulation layer 250 may be disposed on the third insulation layer 240 on which the first pattern PT1 is disposed. The fourth insulation layer 250 may be disposed to cover the first pattern PT1. The first color filter CF may be disposed on the fourth insulation layer 250. The fifth insulation layer 260 may be disposed on the fourth insulation layer 250 on which the color filter CF is disposed. The fifth insulation layer 260 may be disposed to cover the color filter CF. The common electrode CE may be disposed on the fifth insulation layer 260. The sixth insulation layer 270 may be disposed on the fifth insulation layer 260 on which the common electrode CE is disposed. The sixth insulation layer 270 may be disposed to cover the common electrode CE.

The second contact hole CNT2 may be defined or formed through the fourth to sixth insulation layers 250, 260 and 270. The second contact hole CNT2 may expose the first pattern PT1. The second contact hole CNT2 may have truncated cone shape whose lower end is narrower than the upper end. The second contact hole CNT2 has a second width at the lower end. The second contact hole CNT2 may overlap the first contact hole CNT1. In such an embodiment, the second width of the second contact hole CNT2 may be greater than or equal to the first width of the first contact hole CNT1.

The pixel electrode PE may be disposed on the sixth insulation layer 270. The pixel electrode PE may be electrically connected to the first pattern PT1 through the second contact hole CNT2.

Although not shown in figures, the display apparatus may include an opposite substrate facing the base substrate, and a liquid crystal layer between the base substrate and the opposite substrate.

FIGS. 7A to 7I are cross-sectional views illustrating an exemplary embodiment of a method of manufacturing the display apparatus of FIG. 1A.

Figure 7A:
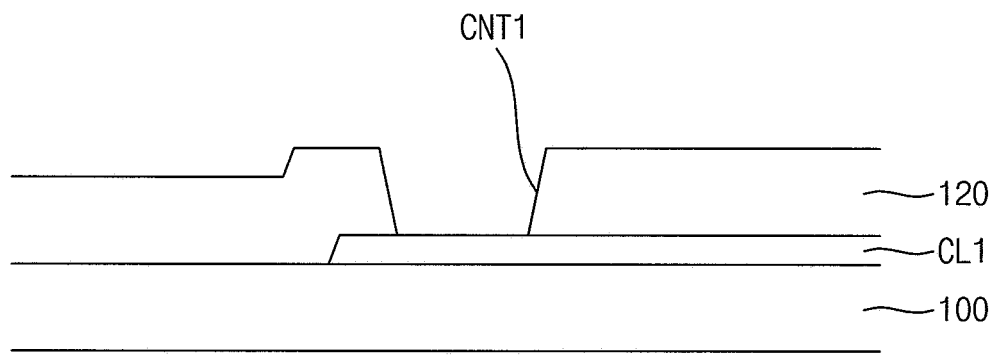
FIGS. 7A to 7I are cross-sectional views illustrating an exemplary embodiment of a method of manufacturing the display apparatus of FIG. 1A.

Referring to FIG. 7A, a first conductive pattern CL1 may be provided or formed on a base substrate 100. A first insulation layer 120 may be provided or formed on the base substrate 100 on which the first conductive pattern CL1 is provided. The first insulation layer 120 may be formed to cover the first conductive pattern CL1.

A first contact hole CNT1 may be formed through the first insulation layer 120. In an exemplary embodiment, a photoresist may be formed on the first insulation layer 120, and then the first insulation layer 120 may be partially etched after exposing and developing the photoresist using a mask, such that the first contact hole CNT1 may be formed.

Figure 7B:
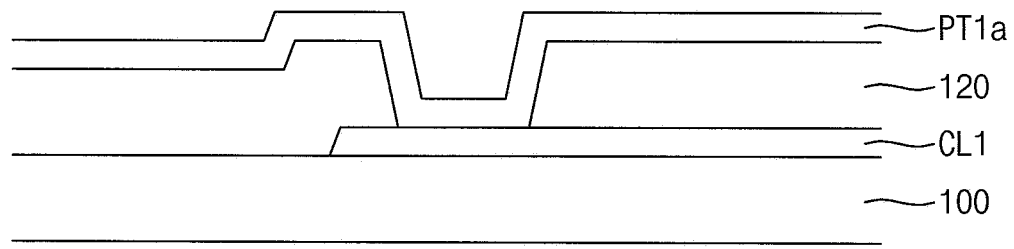

Referring to FIG. 7B, a first pattern layer PT1a may be provided or formed on the first insulation layer 120 through which the first contact hole CNT1 is formed.

Figure 7C:
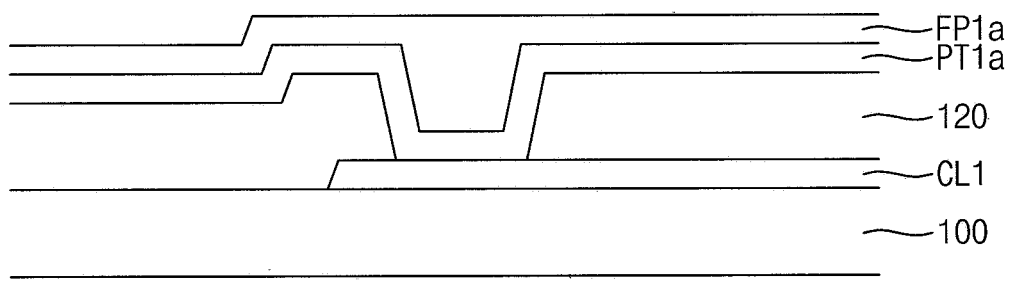

Referring to FIG. 7C, a first filling pattern layer FP1a may be provided or formed on the first pattern layer PT1a. The first filling pattern layer FP1a may be formed using an organic insulation material. In one exemplary embodiment, for example, the first filling pattern layer FP1a may be formed by coating a negative type photoresist on the first pattern layer PT1a. The first filling pattern layer FP1a may be formed to have a thickness enough to fill a recess formed in the first pattern layer PT1a by the first contact hole CNT1.

Figure 7D:
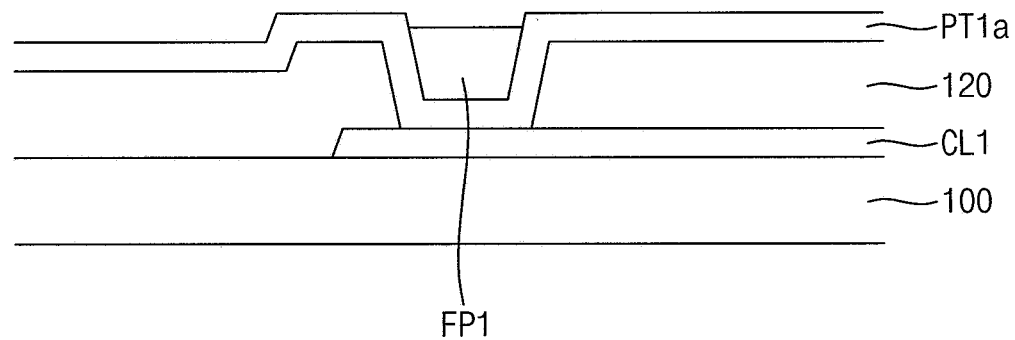

Referring to FIG. 7D, a first filling pattern FP1 may be formed by removing a portion the first filling pattern layer FP1a. In an exemplary embodiment, where the first filling pattern layer FP1a includes a negative type photoresist, the first pattern layer PT1a except for the first filling pattern FP1 may be removed by a developing process without using an exposure process.

In some exemplary embodiment, the first filling pattern FP1 may be formed by an exposure process using a mask and developing process of the first filling pattern layer FP1a.

Figure 7E:
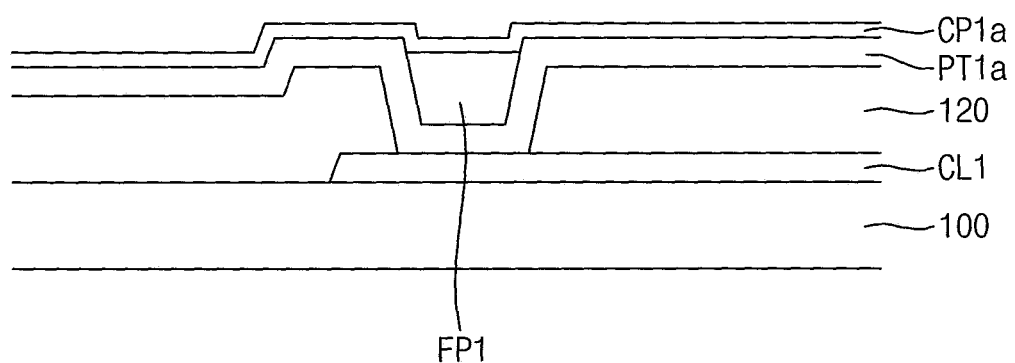

Referring to FIG. 7E, a first capping pattern layer CP1a may be provided or formed on the first pattern layer PT1a on which the first filling pattern FP1 is formed. The first capping pattern layer CP1a may be formed to cover the first filling pattern FP1.

Figure 7F:
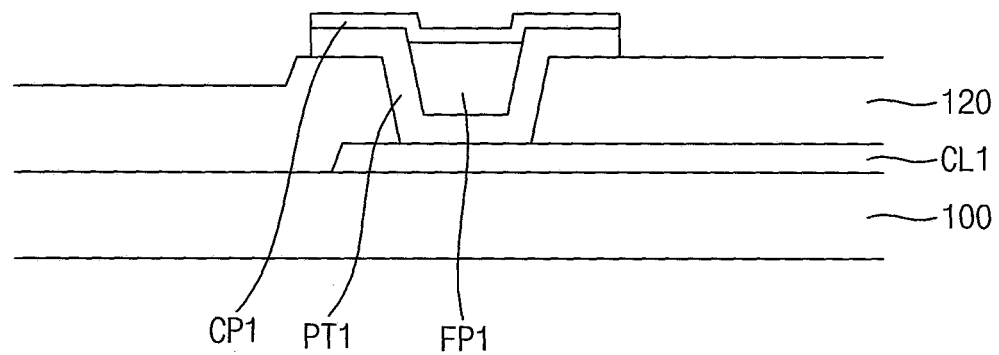

Referring to FIG. 7F, the first capping pattern layer CP1a and the first pattern layer PT1a may be patterned by a same photolithography process or a same etching process using an etching mask. Accordingly, the first capping pattern CP1 and the first pattern PT1 may be obtained.

Figure 7G:
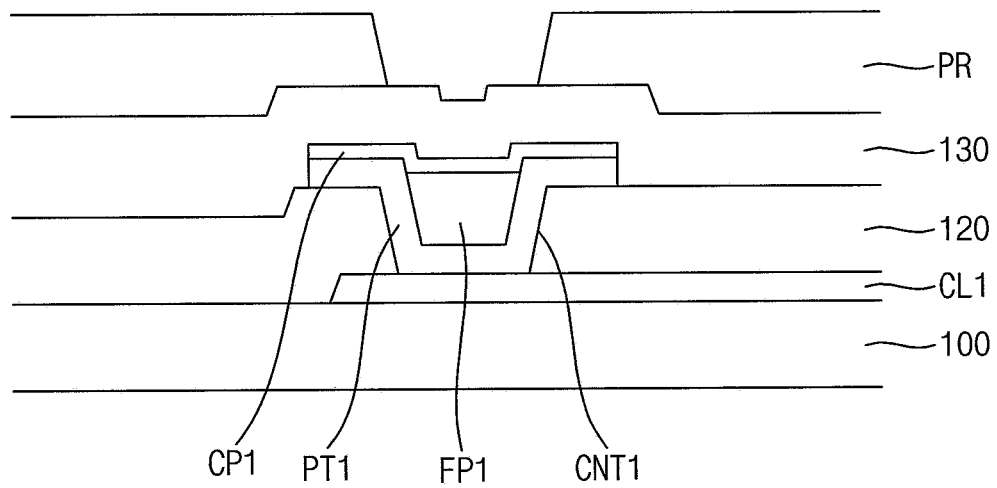

Referring to FIG. 7G, a second insulation layer 130 may be provided or formed on the first insulation layer 120 on which the first capping pattern CP1 is provided. The second insulation layer 130 may be formed to cover the first capping pattern CP1. In such an embodiment, a photoresist layer PR may be provided or formed on the second insulation layer 130, and the photoresist layer PR may be exposed by an exposing process using a mask and developed by a developing process, so that a portion of the second insulation layer 130 where a second contact hole CNT2 will be formed may be exposed. Here, a size of a pattern shape of the mask for forming the second contact hole CNT2 may be greater than or equal to a size of a pattern shape of the mask for forming the first contact hole CNT1.

Figure 7H:
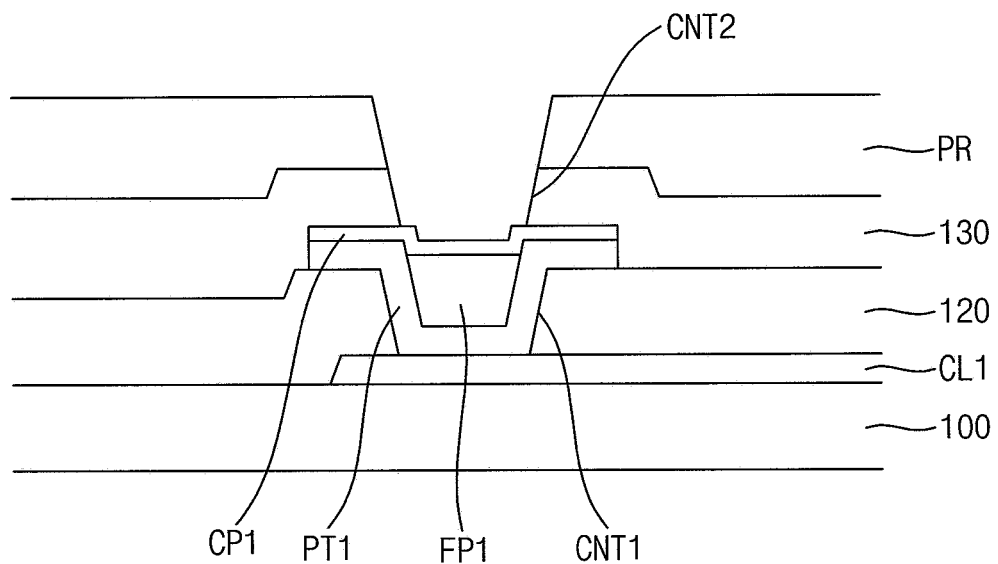

Referring to FIG. 7H, a portion of the second insulation layer 130 may be etched using the photoresist layer PR as a mask to form the second contact hole CNT2.

Figure 7I:
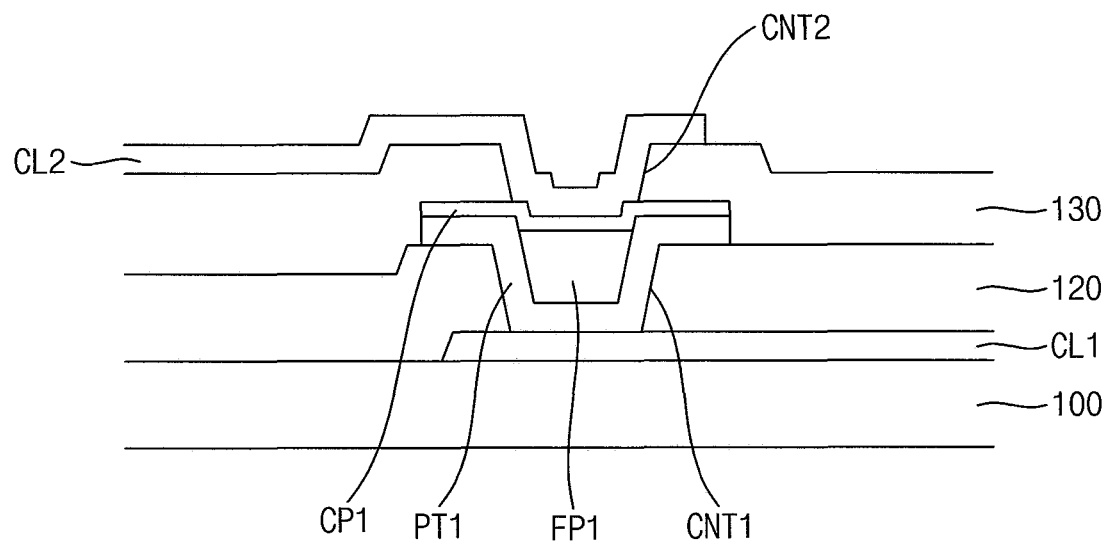

Referring to FIG. 7I, a second conductive pattern CL2 may be provided or formed on the second insulation layer 130 through which the second contact hole CNT2 is formed, and a liquid crystal layer may be provided or formed between an opposite substrate facing the base substrate 100 and the base substrate 100, so that the display apparatus may be manufactured.

FIGS. 8A to 8F are cross-sectional views illustrating an exemplary embodiment of a method of manufacturing the display apparatus of FIG. 2A. The method shown in FIGS. 8A to 8F may be substantially the same as the method of FIGS. 7A to 7I, except that the method does not include a process of providing the first capping pattern. Thus, any repetitive detailed descriptions concerning the same or like elements will be omitted or simplified.

Figure 8A:
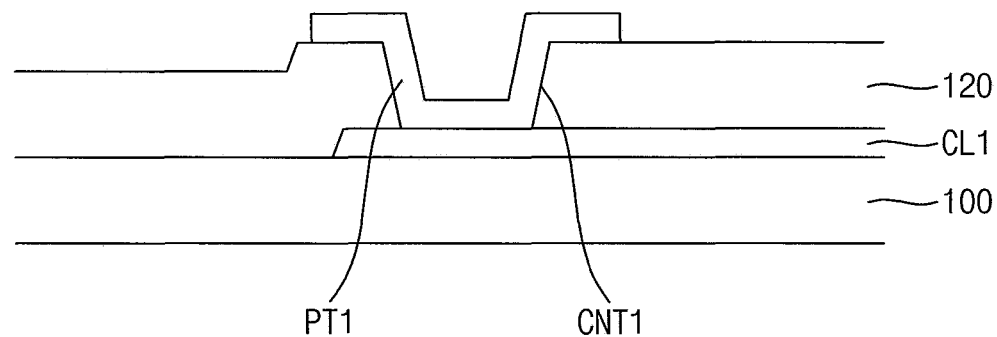
FIGS. 8A to 8F are cross-sectional views illustrating an exemplary embodiment of a method of manufacturing the display apparatus of FIG. 2A.

Referring to FIG. 8A, a first conductive pattern CL1 may be provided or formed on a base substrate 100. A first insulation layer 120 may be provided or formed on the base substrate 100 on which the first conductive pattern CL1 is provided. The first insulation layer 120 may be formed to cover the first conductive pattern CL1. A first contact hole CNT1 may be formed through the first insulation layer 120. A first pattern PT1 may be provided or formed on the first insulation layer 120 through which the first contact hole CNT1 is formed.

In an embodiment, a conductive layer may be formed on the first insulation layer 120, and then the conductive layer may be patterned by a photolithography process or an etching process using an etching mask. In such an embodiment, the first pattern PT1 may be obtained by patterning the conductive layer.

Figure 8B:
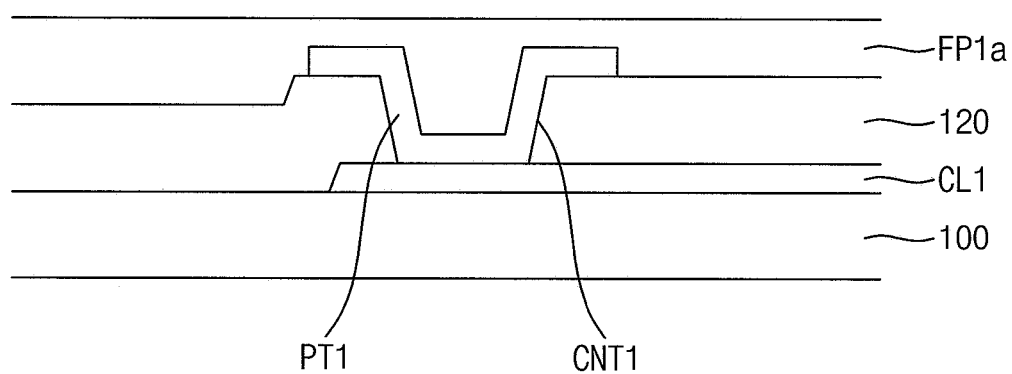

Referring to FIG. 8B, a first filling pattern layer FP1a may be provided or formed on the first pattern layer PT1.

Figure 8C:
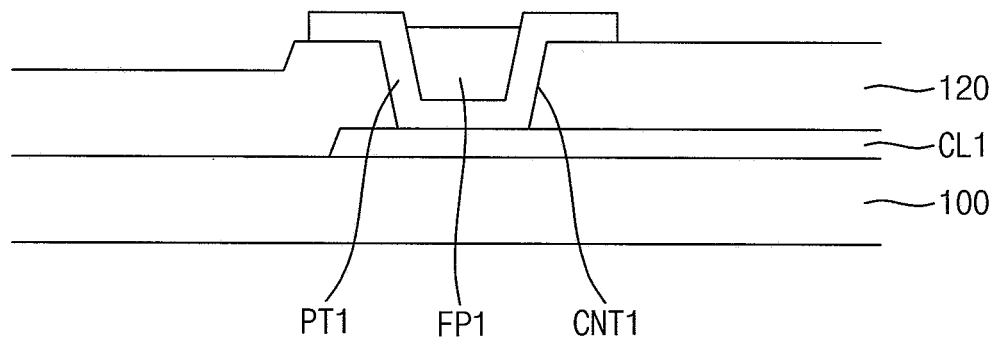

Referring to FIG. 8C, a first filling pattern FP1 may be formed by removing a portion of the first filling pattern layer FP1a.

Figure 8D:
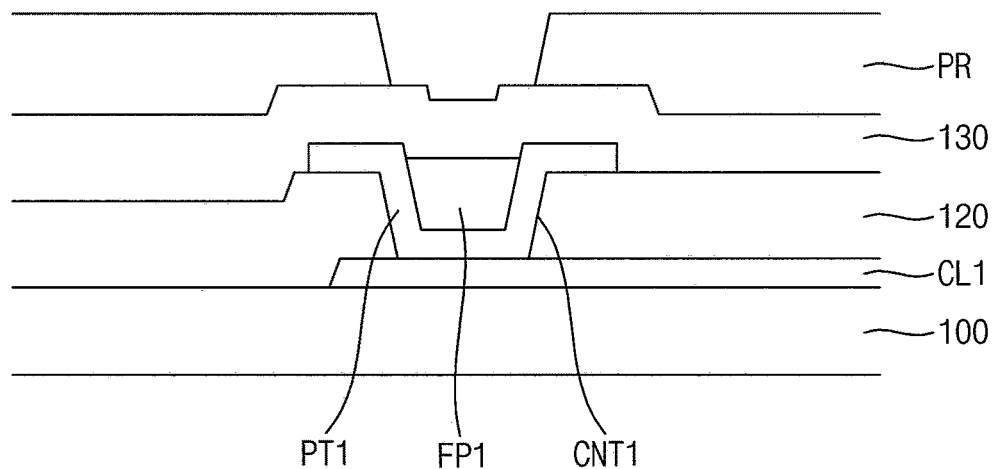

Referring to FIG. 8D, a second insulation layer 130 may be provided or formed on the first insulation layer 120 on which the first filling pattern FP1 is formed. The second insulation layer 130 may be formed to cover the first filling pattern FP1. In an embodiment, a photoresist layer PR may be formed on the second insulation layer 130. And then, the photoresist layer PR may be exposed using a mask and developed, so that a portion of the second insulation layer 130 to be removed is exposed to from a second contact hole CNT2.

Figure 8E:
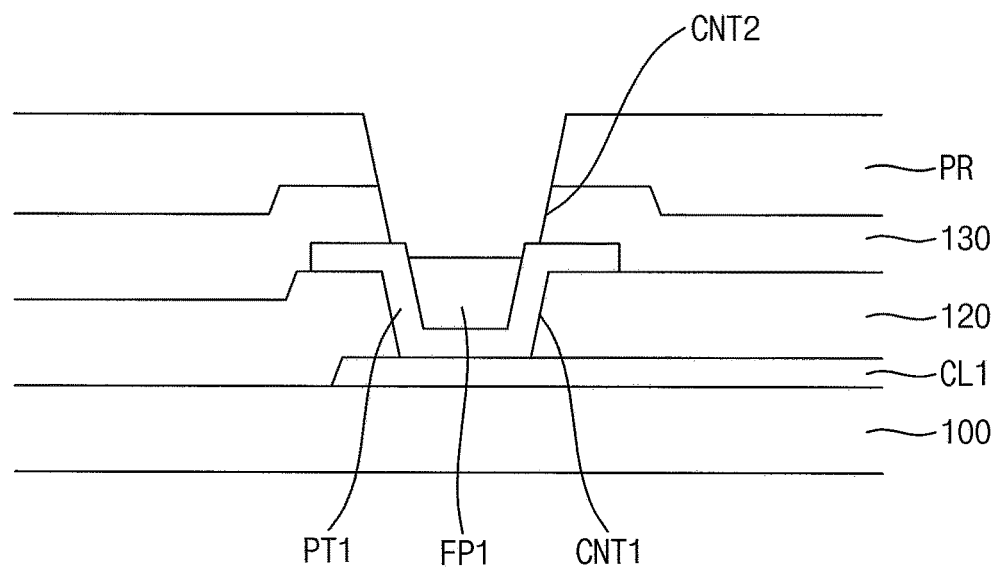

Referring to FIG. 8E, a portion of the second insulation layer 130 may be etched using the photoresist layer PR to form the second contact hole CNT2.

Figure 8F:
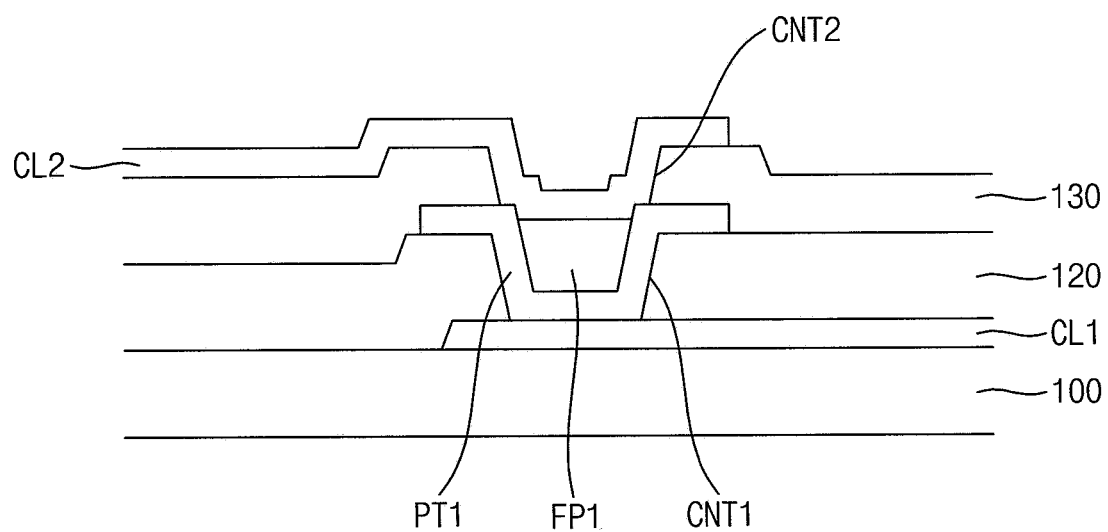

Referring to FIG. 8F, a second conductive pattern CL2 may be provided or formed on the second insulation layer 130 through which the second contact hole CNT2 is formed. The second conductive pattern CL2 is provided in the second contact hold CNT2. And then, a liquid crystal layer may be provided or formed between an opposite substrate facing the base substrate 100 and the base substrate 100, so that the display apparatus may be manufactured.

FIGS. 9A to 9J are cross-sectional views illustrating an exemplary embodiment of a method of manufacturing the display apparatus of FIG. 5.

Figure 9A:
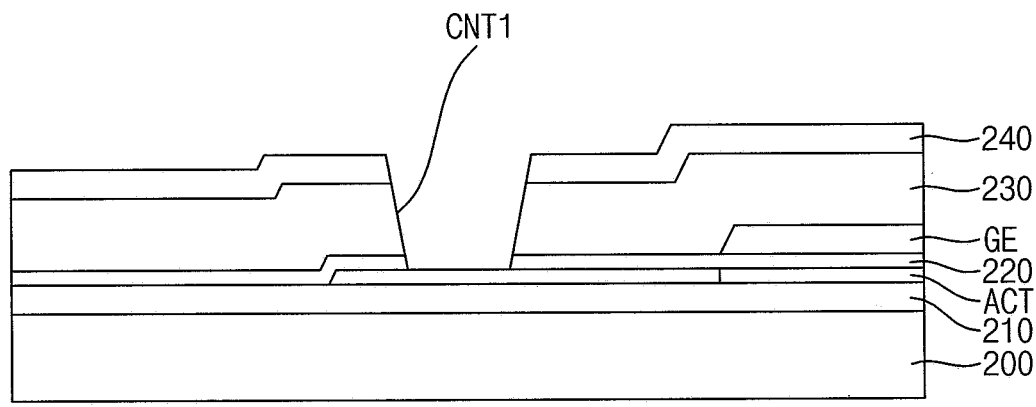
FIGS. 9A to 9J are cross-sectional views illustrating an exemplary embodiment of a method of manufacturing the display apparatus of FIG. 5.

Referring to FIG. 9A, a buffer layer 210 may be provided or formed on a base substrate 200. The buffer layer 210 may be formed by a spin coating process, a chemical vapor deposition ("CVD") process, a plasma enhanced chemical vapor deposition ("PECVD") process, a high density plasma-chemical vapor deposition ("HDP-CVD") process or a printing process, for example.

In such an embodiment, an active pattern ACT may be provided or formed on the buffer layer 210.

In such an embodiment, a semiconductor layer (not illustrated) may be formed on the buffer layer 210, and then a preliminary active layer (not illustrated) may be formed on the buffer layer 210 by patterning the semiconductor layer. In such an embodiment, the crystallization process may be performed for the preliminary active layer to form the active pattern ACT on the buffer layer 210. In such an embodiment, the semiconductor layer may be formed by a CVD process, a PECVD process, a low pressure chemical vapor deposition ("LPCVD") process, a sputtering process or a printing process, for example. In an embodiment, where the semiconductor layer includes an amorphous silicon, the active pattern ACT may include a polysilicon. The crystallization process for forming the active pattern ACT may include a laser irradiation process, a thermal treatment process, or a thermal process utilizing a catalyst, for example. In some exemplary embodiments, a dehydrogenation process may be performed for the semiconductor layer and/or the preliminary active layer after forming the semiconductor layer and/or the preliminary active layer on the buffer layer 210. The dehydrogenation process may reduce the hydrogen concentration of the semiconductor layer and/or the preliminary active layer, so that the active pattern ACT may have improved electrical characteristics.

In such an embodiment, a first insulation layer 220 may be formed on the buffer layer 210 on which the active pattern ACT is formed. The first insulation layer 220 may be formed to cover the active pattern ACT. The first insulation layer 220 may be formed by a CVD process, a spin coating process, a PECVD process, a sputtering process, a vacuum evaporation process, an HDP-CVD process or a printing process, for example.

In such an embodiment, a gate pattern including a gate electrode GE may be provided or formed on the first insulation layer 220. A conductive layer may be formed on the first insulation layer 220, and then the conductive layer may be patterned by a photolithography process or an etching process using an additional etching mask such that the gate pattern may be obtained by patterning the conductive layer. In such an embodiment, the conductive layer may be formed by a printing process, a sputtering process, a CVD process, a pulsed laser deposition ("PLD") process, a vacuum evaporation process or an atomic layer deposition ("ALD") process, for example.

In an embodiment, a second insulation layer 230 may be provided or formed on the first insulation layer 220. A first data pattern (not shown in figures) may be provided or formed on the second insulation layer 230. A third insulation layer 240 may be provided or formed on the second insulation layer 230 on which the first data pattern is provided. The third insulation layer 240 may be formed to cover the first data pattern. A first contact hole CNT1 may be formed through the first to third insulation layer 220, 230 and 240.

Figure 9B:
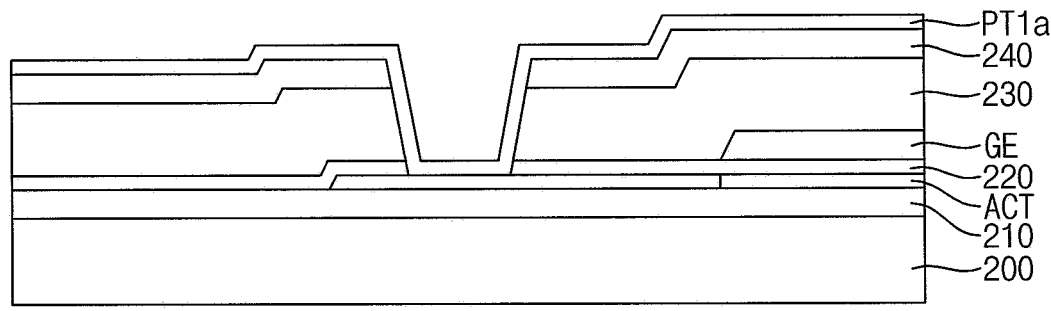

Referring to FIG. 9B, a first pattern layer PT1a may be formed on the third insulation layer 240 and in the first contact hole CNT1 formed therethrough.

Figure 9C:
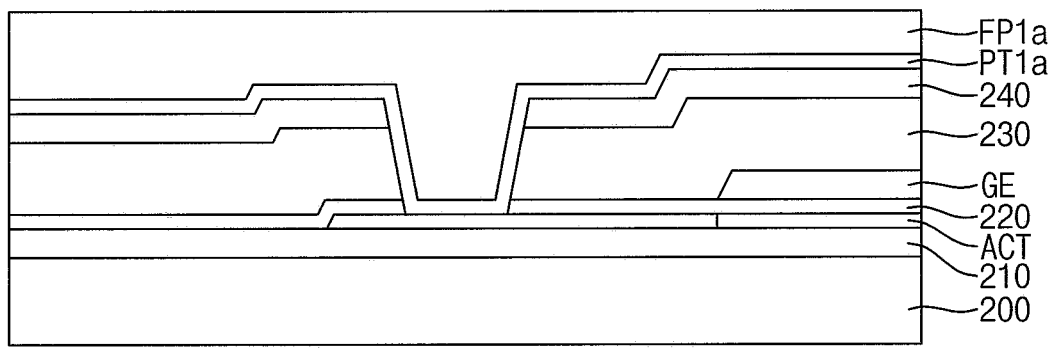

Referring to FIG. 9C, a first filling pattern layer FP1a may be provided or formed on the first pattern layer PT1a. The first filling pattern layer FP1a may include or be formed using an organic insulation material. In one exemplary embodiment, for example, the first filling pattern layer FP1a may be formed by coating a negative type photoresist on the first pattern layer PT1a. The first filling pattern layer FP1a may be formed to have a predetermined thickness, which is great enough to fill a recess formed in the first pattern layer PT1a by the first contact hole CNT1.

Figure 9D:
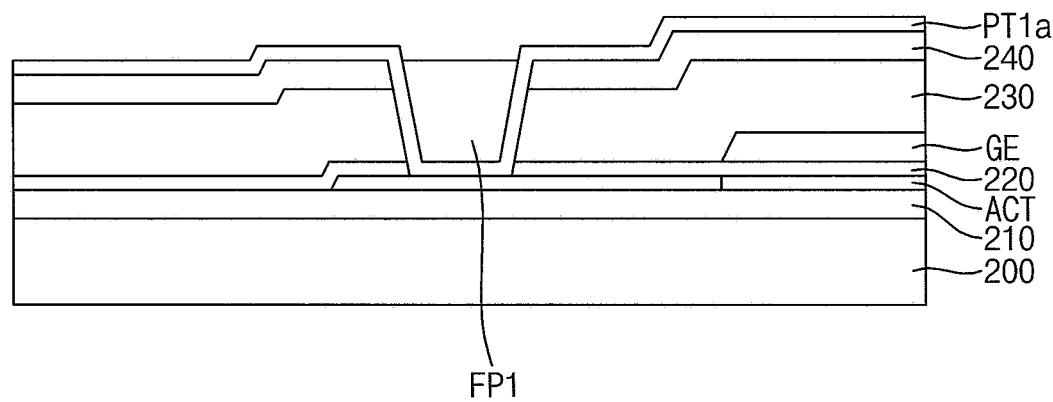

Referring to FIG. 9D, a first filling pattern FP1 may be formed by removing a portion the first filling pattern layer FP1a. In an embodiment, where the first filling pattern layer FP1a includes a negative type photoresist, the first pattern layer PT1a except for the first filling pattern FP1 may be removed by a developing process without using an exposure process.

In some exemplary embodiment, the first filling pattern FP1 may be formed by an additional exposure process using a mask and developing process of the first filling pattern layer FP1a.

Figure 9E:
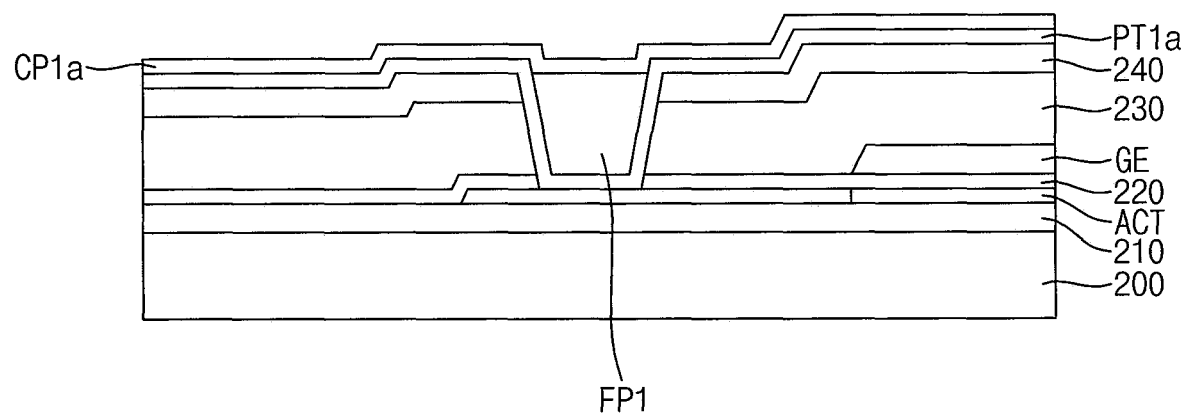

Referring to FIG. 9E, a first capping pattern layer CP1a may be provided or formed on the first pattern layer PT1a on which the first filling pattern FP1 is formed. The first capping pattern layer CP1a may be formed to cover the first filling pattern FP1.

Figure 9F:
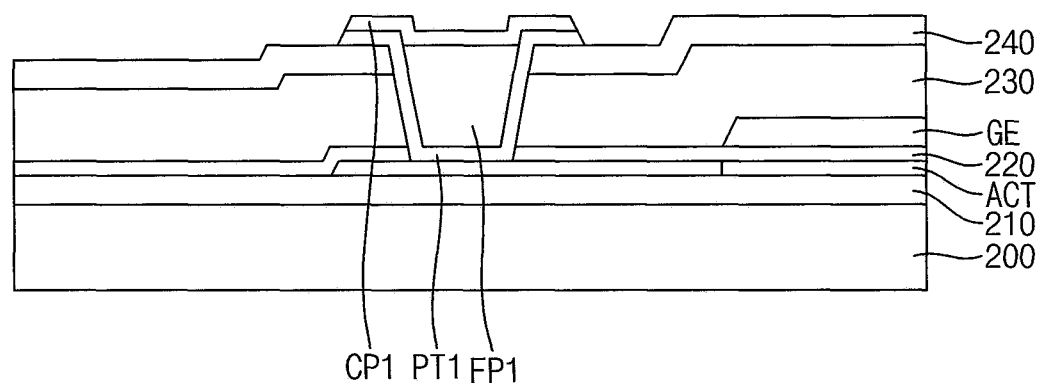

Referring to FIG. 9F, the first capping pattern layer CP1a and the first pattern layer PT1a may be simultaneously patterned by a photolithography process or an etching process using an etching mask, such that the first capping pattern CP1 and the first pattern PT1 may be obtained.

Figure 9G:
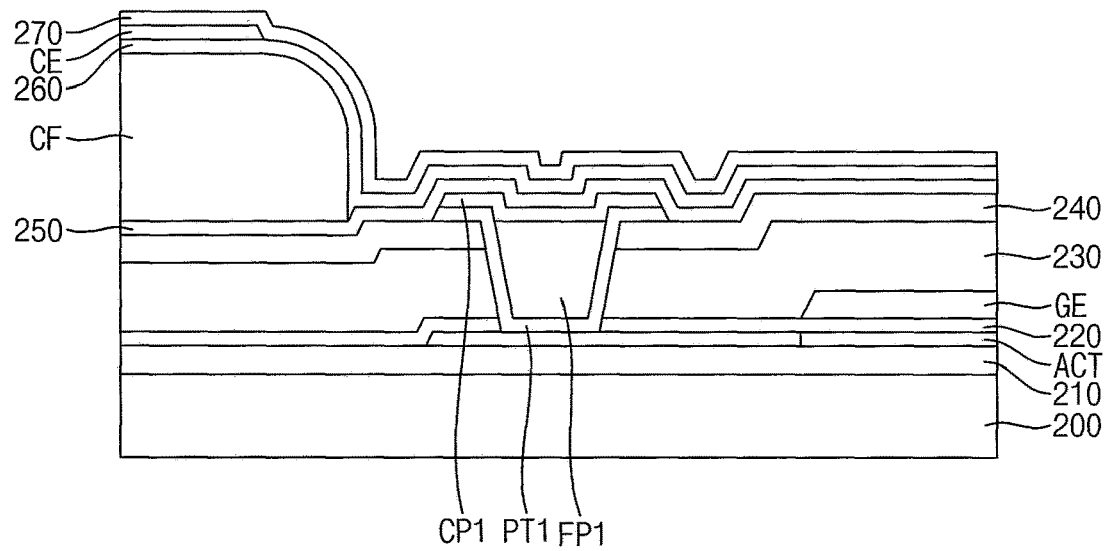

Referring to FIG. 9G, a fourth insulation layer 250 may be provided or formed on the third insulation layer 240 on which the first capping pattern CP1 is formed. The fourth insulation layer 250 may be formed to cover the first capping pattern CP1. A color filter CF may be provided or formed on the fourth insulation layer 250. A fifth insulation layer 260 may be provided or formed on the fourth insulation layer 250 on which the color filter CF is formed. The fifth insulation layer 260 may be formed to cover the color filter CF. A common electrode CE may be provided or formed on the fifth insulation layer 260 to overlap the color filter CF. A sixth insulation layer 270 may be provided or formed on the fifth insulation layer 260 on which the color filter CF is formed. The sixth insulation layer 270 may be formed to cover the color filter CF.

Figure 9H:
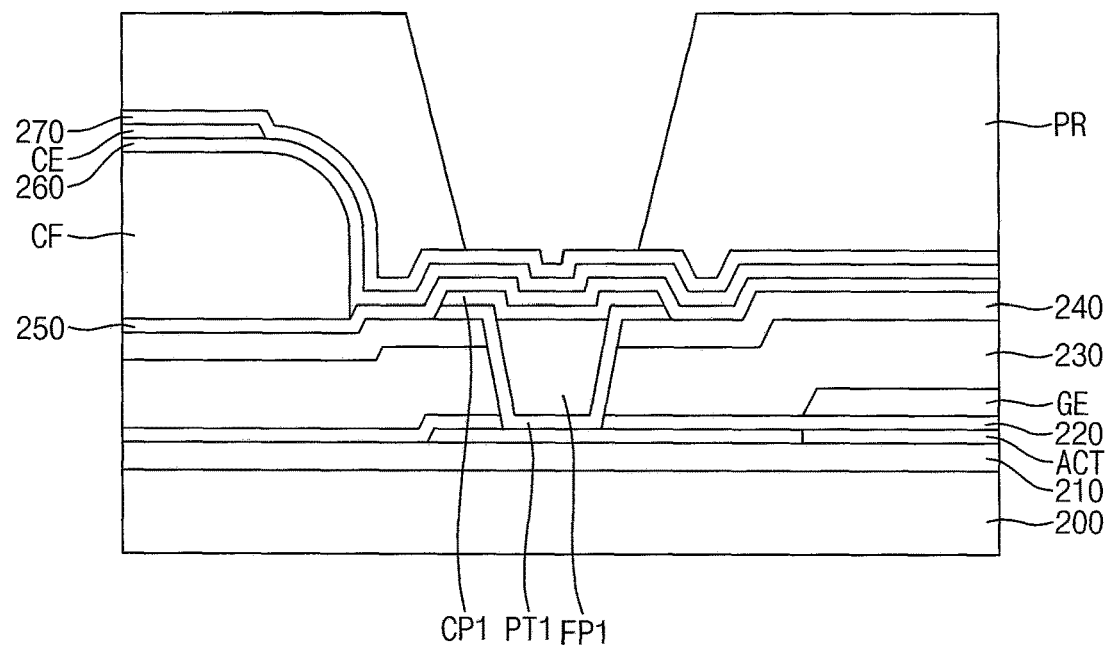

Referring to FIG. 9H, a photoresist layer PR may be provided or formed on the sixth insulation layer 270. And then, the photoresist layer PR may be exposed by exposing process using a mask and developing process, so that a portion of the sixth insulation layer 270 to be removed is exposed to form a second contact hole CNT2. In such an embodiment, a size of a pattern shape of the mask for forming the second contact hole CNT2 may be greater than or equal to a size of a pattern shape of the mask for forming the first contact hole CNT1.

Figure 9I:
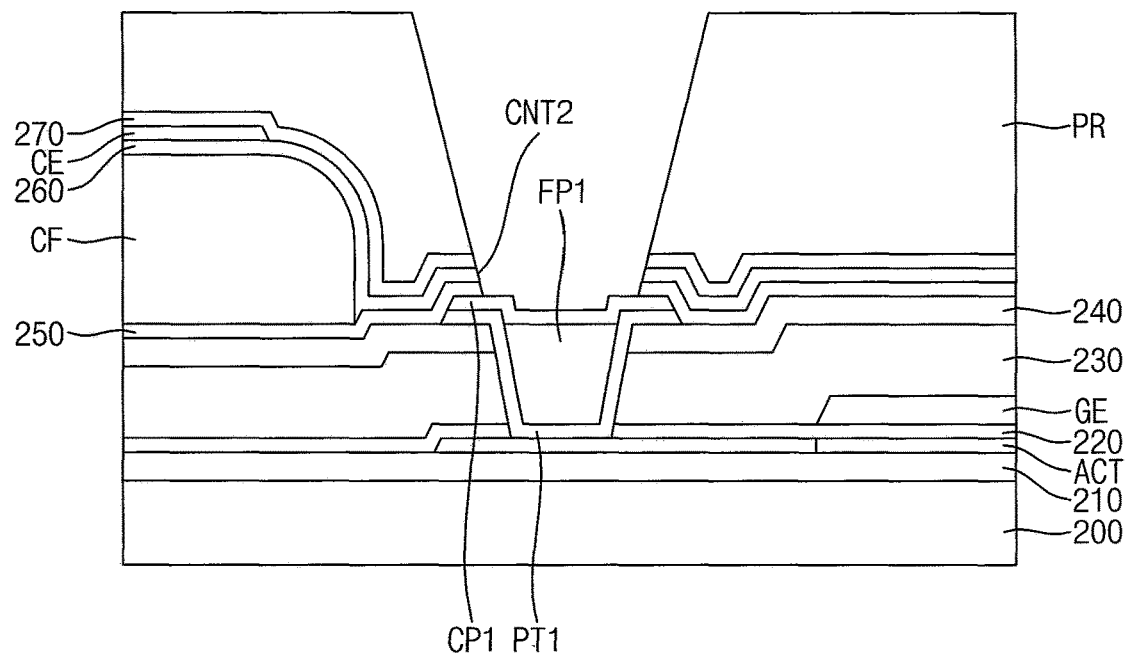

Referring to FIG. 9I, a portion of the fourth to sixth insulation layers 250, 260 and 270 may be etched using the photoresist layer PR as a mask to form the second contact hole CNT2.

Figure 9J:
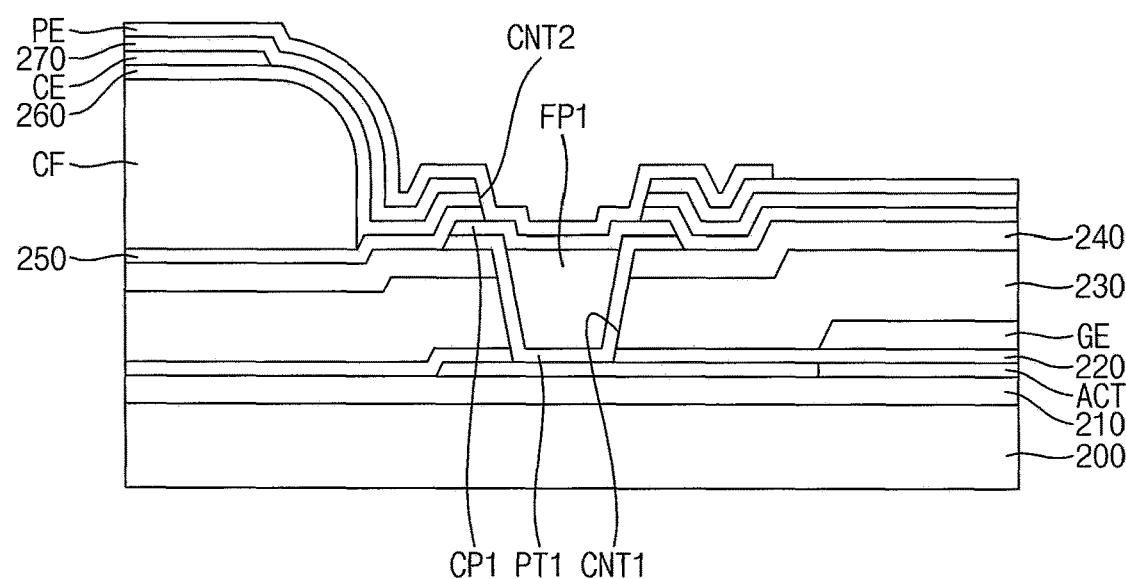

Referring to FIG. 9J, a pixel electrode PE may be provided or formed on the sixth insulation layer 270 through which the second contact hole CNT2 is formed. And then, a liquid crystal layer may be provided or formed between an opposite substrate facing the base substrate 200 and the base substrate 200, so that the display apparatus may be manufactured.

In such an embodiment, the first filling pattern FP1 may be formed only by forming a photoresist layer and developing the photoresist layer without using an exposing process, and the first capping pattern CP1 may be pattern with the first pattern PT1, so that manufacturing process may be simplified.

FIGS. 10A to 10I are cross-sectional views illustrating an exemplary embodiment of a method of manufacturing the display apparatus of FIG. 6. The method shown in FIGS. 10A to 10I may be substantially same as the method of FIGS. 9A to 9J, except that the method does not include forming a first capping pattern. Thus, any repetitive detailed descriptions concerning the same elements will be omitted or simplified.

Figure 10A:
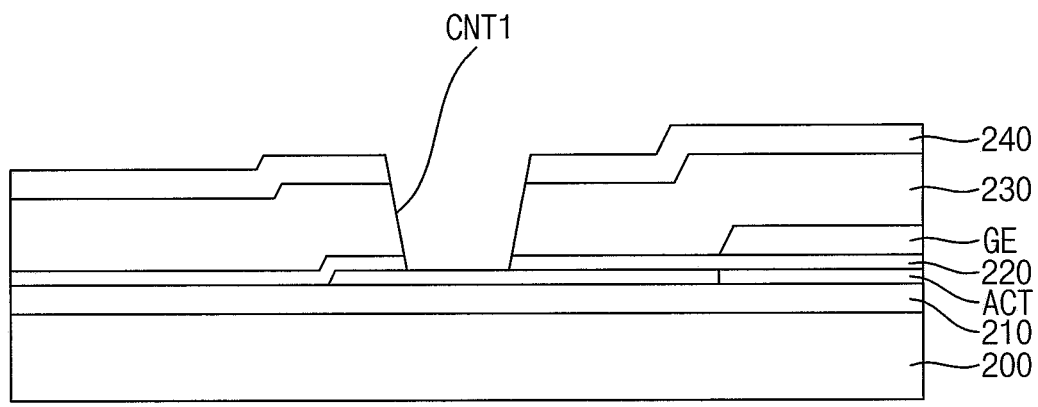
FIGS. 10A to 10I are cross-sectional views illustrating an exemplary embodiment of a method of manufacturing the display apparatus of FIG. 6.

Referring to FIG. 10A, in an exemplary embodiment of a method of manufacturing the display apparatus, a buffer layer 210 may be provided or formed on a base substrate 200. An active pattern ACT may be provided or formed on the buffer layer 210. A first insulation layer 220 may be provided or formed on the buffer layer 210 on which the active pattern ACT is formed. The first insulation layer 220 may be formed to cover the active pattern ACT. A gate pattern including a gate electrode GE may be provided or formed on the first insulation layer 220. A second insulation layer 230 may be provided or formed on the first insulation layer 220 on which the gate pattern is formed. The second insulation layer 230 may be formed to cover the gate pattern. A first data pattern (not shown in figures) may be provided or formed on the second insulation layer 230. A third insulation layer 240 may be provided or formed on the second insulation layer 230 on which the first data pattern is formed. The third insulation layer 240 may be formed to cover the first data pattern. A first contact hole CNT1 may be formed through the first to third insulation layers 220, 230 and 240.

Figure 10B:
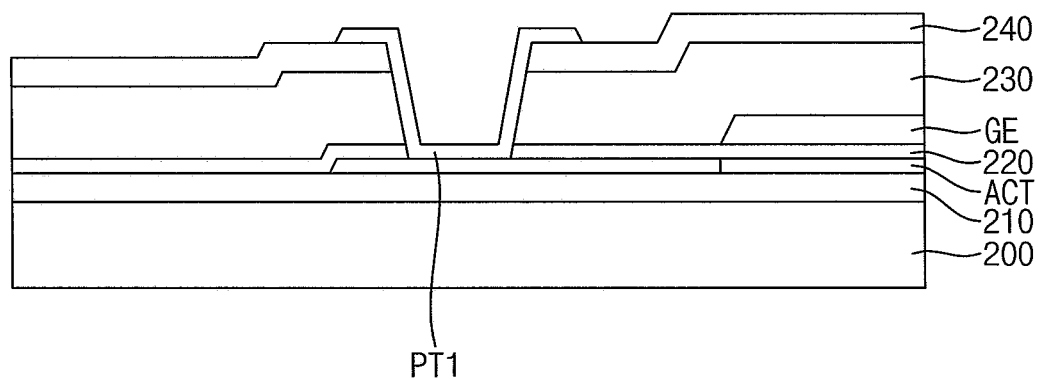

Referring to FIG. 10B, a first pattern PT1 may be provided or formed on the third insulation layer 240 through which the first contact hole CNT1 is formed. A conductive layer may be provided or formed on the third insulation layer 240, and then the conductive layer may be patterned by a photolithography process or an etching process using an etching mask. Hence, the first capping pattern CP1 and the first pattern PT1 may be obtained.

Figure 10C:
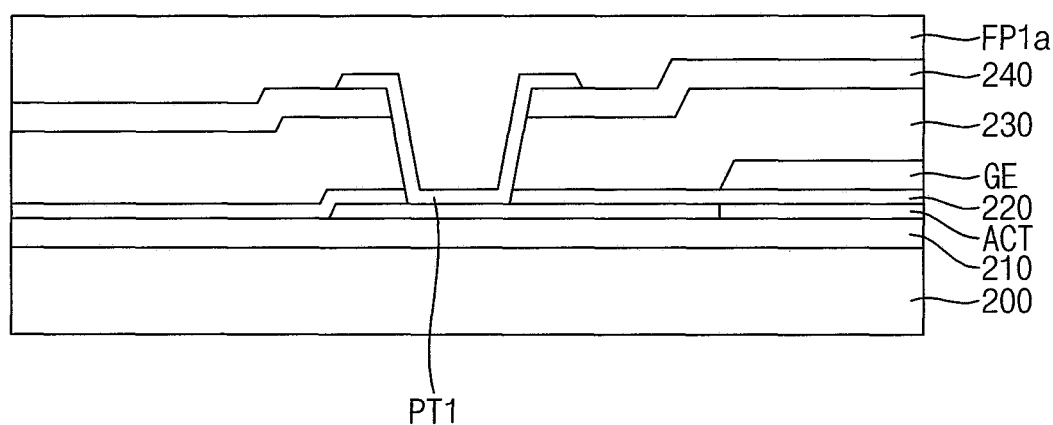

Referring to FIG. 10C, a first filling pattern layer FP1a may be provided or formed on the first pattern PT1.

Figure 10D:
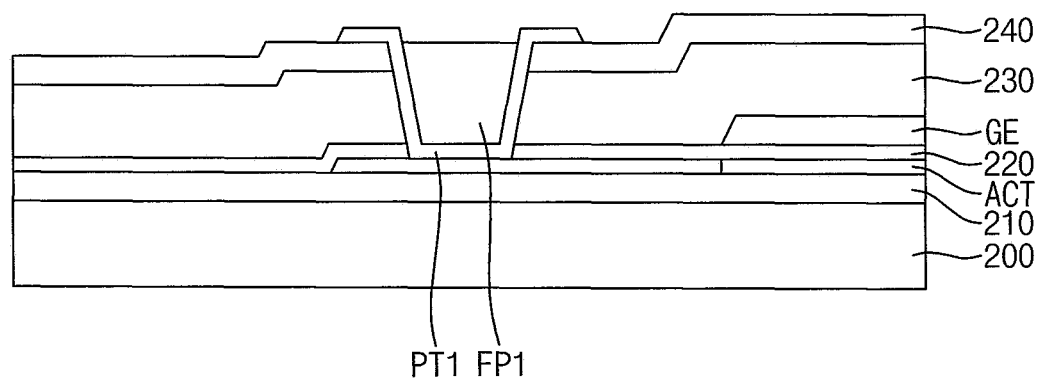

Referring to FIG. 10D, a first filling pattern FP1 may be formed by removing a portion of the first filling pattern layer FP1a.

Figure 10E:
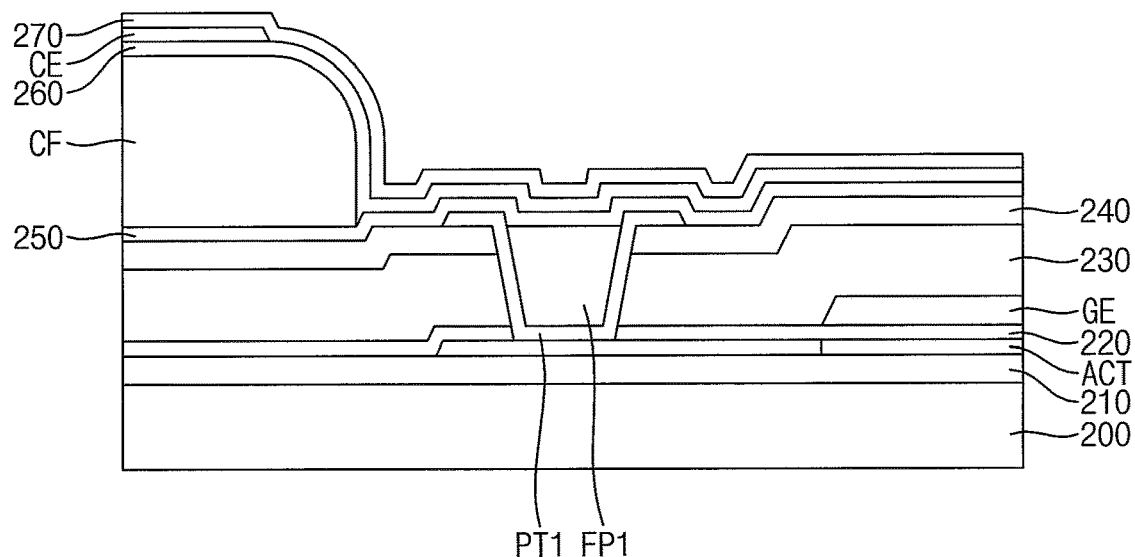

Referring to FIG. 10E, a fourth insulation layer 250 may be provided or formed on the third insulation layer 240 through which the first filling pattern FP1 is formed. A color filter CF may be provided or formed on the fourth insulation layer 250. A fifth insulation layer 260 may be provided or formed on the fourth insulation layer 250 on which the color filter CF is formed. The fifth insulation layer 260 may be formed to cover the color filter CF. A common electrode CE may be provided or formed on the fifth insulation layer 260 to overlap the color filter CF. A sixth insulation layer 270 may be provided or formed on the fifth insulation layer 260 on which the color filter CF is formed. The sixth insulation layer 270 may be formed to cover the color filter CF.

Figure 10F:
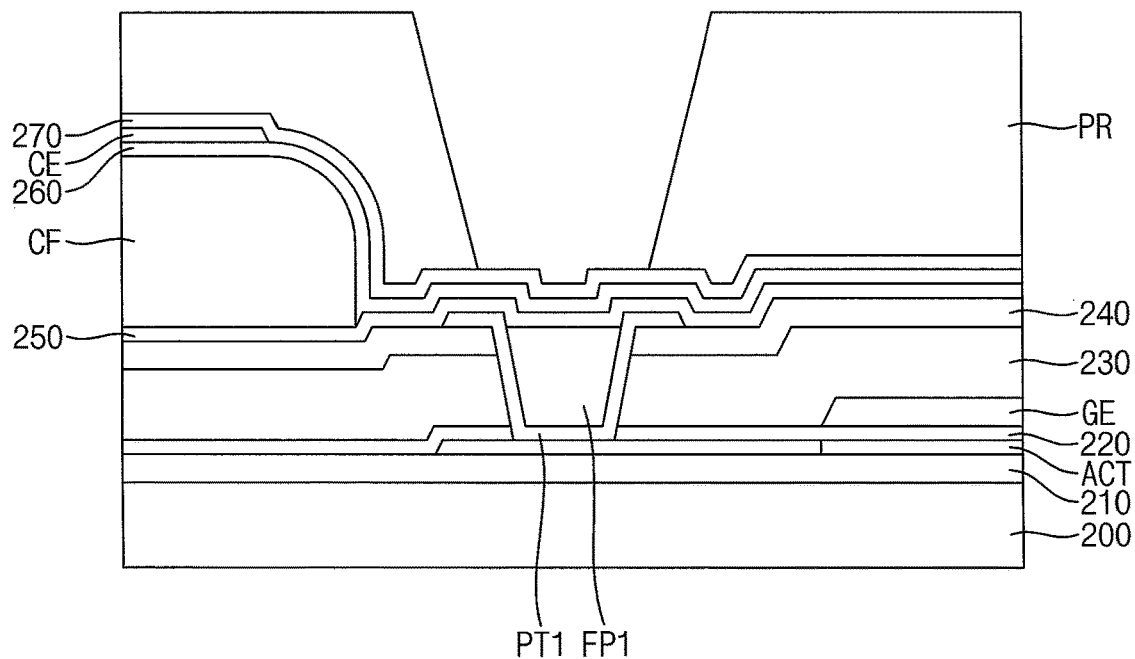

Referring to FIG. 10F, a photoresist layer PR may be provided or formed on the sixth insulation layer 270. And then, the photoresist layer PR may be exposed by exposing process using a mask and developing process, so that a portion of the sixth insulation layer 270 to be removed to from a second contact hole CNT2 can be exposed through the photoresist layer PR. Here, a size of a pattern shape of the mask for forming the second contact hole CNT2 may be greater than or equal to a size of a pattern shape of the mask for forming the first contact hole CNT1.

Figure 10G:
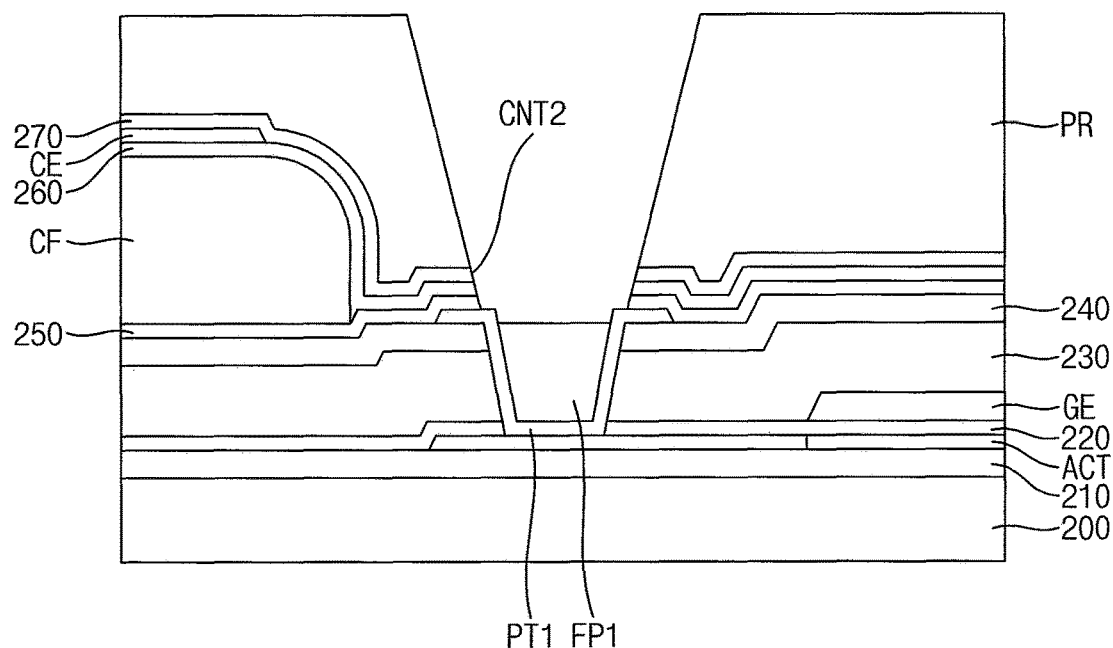

Referring to FIG. 10G, a second contact hole CNT2 may be formed by etching the fourth to sixth insulation layers 250, 260 and 270 using the photoresist layer PR.

Figure 10H:
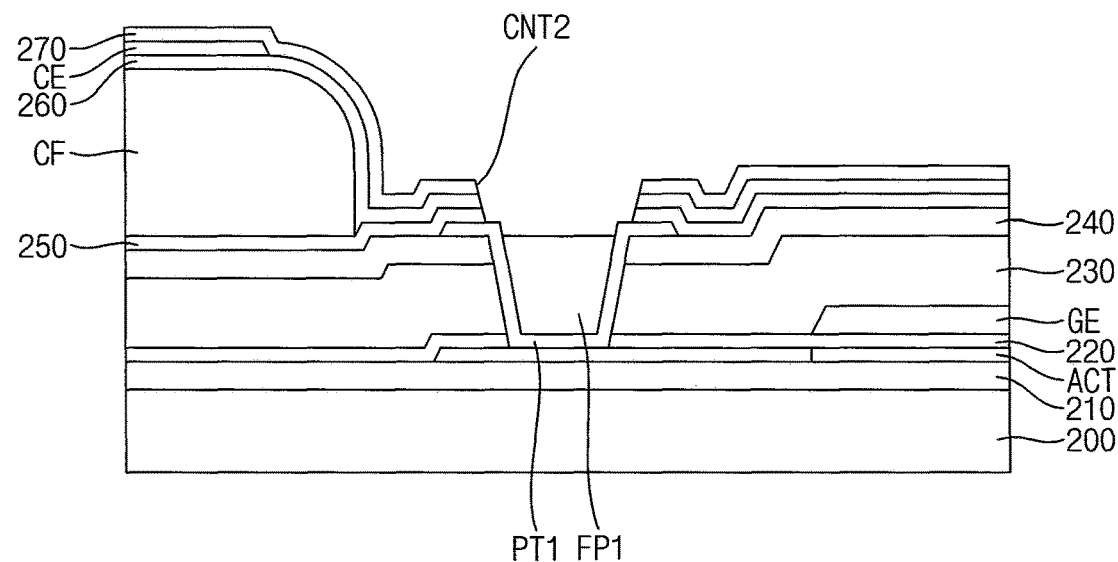

Referring to FIG. 10H, the photoresist layer PR may be removed.

Figure 10I:
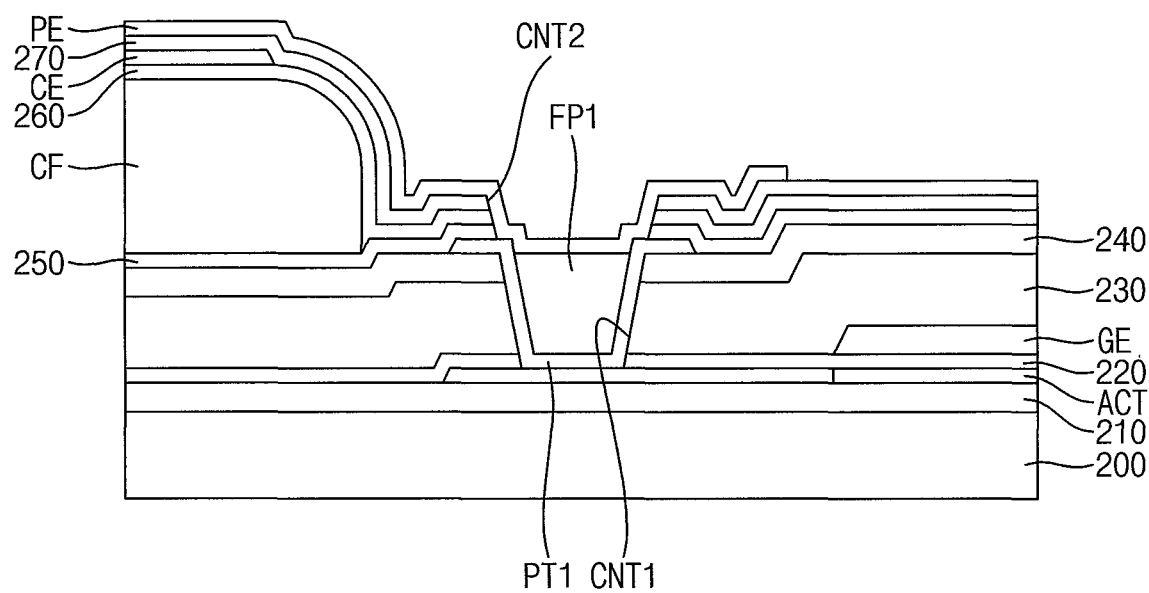

Referring to FIG. 10I, a pixel electrode PE may be provided or formed on the sixth insulation layer 270 through which the second contact hole CNT2 is formed. And then, a liquid crystal layer may be provided or formed between an opposite substrate facing the base substrate 200 and the base substrate 200, so that the display apparatus may be manufactured.

According to exemplary embodiments of the invention, as the first contact hole and the second contact hole are disposed to overlap each other, non-opening area where the image is not displayed by the contact hole is minimized, and an aperture ratio may be improved or increased compared to a conventional, structure that the contact holes do not overlap each other. Accordingly, a high-resolution display apparatus, in which the size of each pixel, is relatively small may be realized.

In exemplary embodiments, the first filling pattern may fill the recess of the first pattern formed by the first contact hole, so that the first capping pattern may be formed to have a relatively flat surface. Accordingly, contact area of the second conductive pattern and the first capping pattern through the second contact hole, which overlaps the first contact hole, may be secured.

In exemplary embodiments, the first width of the first contact hole is smaller than or equal to the second width of the second contact hole, and the first width may be less than about 2 μm, so that a non-opening area where the image is not displayed and the contact hole is located may be minimized.

In exemplary embodiments, when a portion of the second insulation layer is removed to form the second contact hole, the upper surface of the first capping pattern is sufficiently high by the first filling pattern, so that etching degree of the second insulating layer for exposing the first capping pattern is respectively small compared to a conventional structure in which the first filling pattern does not exist. Accordingly, it is less likely that the pattern (e.g., the first capping pattern or the first pattern) will be damaged by over-etching of the second insulating layer.

In exemplary embodiments, the first filling pattern may be formed only by forming a photoresist layer and developing the photoresist layer without an additional exposing process, and the first capping pattern may be pattern with the first pattern, so that manufacturing process may be minimized.

The foregoing is illustrative of the invention and is not to be construed as limiting thereof. Although some exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display apparatus, comprising:
   a base substrate;
   a first conductive pattern disposed on the base substrate;
   a first insulation layer disposed on the base substrate to cover the first conductive pattern, wherein a first contact hole is defined through the first insulation layer;
   a first pattern disposed on the first insulation layer, wherein the first pattern is in contact with the first conductive pattern through the first contact hole;
   a first filling pattern disposed in a recess of the first pattern which is defined by the first contact hole;
   a second insulation layer disposed on the first pattern and the first insulation layer, wherein a second contact hole overlapping the first contact hole is defined through the second insulation layer; and
   a second conductive pattern electrically connected to the first pattern through the second contact hole,
   wherein
   an upper width of the first contact hole is less than a lower width of the second contact hole, and
   at least a portion of the first pattern extends to an upper surface of the first insulation layer.

2. The display apparatus of claim 1, wherein
   each of the first and second contact holes has a truncated cone shape, in which a lower end thereof is narrower than an upper end thereof,
   the first contact hole has a first width at the lower end thereof,
   the second contact hole has a second width at the lower end thereof, and
   the second width is greater than or equal to the first width.

3. The display apparatus of claim 2, wherein the first width is less than 2 micrometers.

4. The display apparatus of claim 1, wherein the first filling pattern comprises a photoresist.

5. The display apparatus of claim 1, wherein a contacting surface of the first pattern and the second conductive pattern has a ring shape.

6. The display apparatus of claim 1, further comprising:
   a first capping pattern disposed between the first filling pattern and the second conductive pattern and in contact with the first pattern, the first filling pattern and the second conductive pattern.

7. The display apparatus of claim 6, wherein a contacting surface of the first pattern and the second conductive pattern has a circle shape.

8. The display apparatus of claim 7, wherein the contacting surface of the first pattern and the second conductive pattern is within a boundary of an upper end of the first contact hole.

9. The display apparatus of claim 1, wherein
   the first conductive pattern comprises an element of a thin film transistor, and
   the second conductive pattern comprises a pixel electrode.

10. The display apparatus of claim 9, further comprising:
    a color filter disposed between the pixel electrode and the second insulation layer.

11. The display apparatus of claim 10, further comprising:
    a common electrode disposed between the color filter and the pixel electrode.

12. A display apparatus, comprising:
    a base substrate;
    a first conductive pattern disposed on the base substrate;
    a first insulation layer disposed on the base substrate to cover the first conductive pattern, wherein a first contact hole is defined through the first insulation layer;
    a first pattern disposed on the first insulation layer to be in contact with the first conductive pattern through the first contact hole;
    a first filling pattern disposed in a recess of the first pattern which is defined by the first contact hole;
    a second insulation layer disposed on the first pattern and the first insulation layer, wherein a second contact hole overlapping the first contact hole is defined through the second insulation layer;
    a second pattern disposed on the second insulation layer, wherein the second pattern is in contact with the first pattern through the second contact hole;
    a second filling pattern disposed in a recess of the second pattern which is defined by the second contact hole;
    a third insulation layer disposed on the second pattern and the second insulation layer, wherein a third contact hole overlapping the second contact hole is defined through the third insulation layer; and
    a second conductive pattern electrically connected to the second pattern through the third contact hole,
    wherein an upper width of the first contact hole is less than a lower width of the second contact hole, and
    at least a portion of the first pattern extends to an upper surface of the first insulation layer.

13. The display apparatus of claim 12, wherein
    each of the first to third contact holes has a truncated cone shape, in which a lower end thereof is narrower than an upper end thereof, the first contact hole has a first width at the lower end thereof, the second contact hole has a second width at the lower end thereof, the third contact hole has a third width at the lower end thereof, and the second width is greater than or equal to the first width, and the third width is greater than or equal to the second width.

14. The display apparatus of claim 12, further comprising:

a first capping pattern disposed between the first filling pattern and the second pattern, and in contact with the first pattern, the first filling pattern and the second pattern; and a second capping pattern disposed between the second filling pattern and the second conductive pattern, and in contact with the second pattern, the second filling pattern and the second conductive pattern.

\* \* \* \* \*